US006825126B2

United States Patent
Asai et al.

(10) Patent No.: US 6,825,126 B2
(45) Date of Patent: Nov. 30, 2004

(54) MANUFACTURING METHOD OF SEMICONDUCTOR DEVICE AND SUBSTRATE PROCESSING APPARATUS

(75) Inventors: Masayuki Asai, Tokyo (JP); Sadayoshi Horii, Tokyo (JP); Kanako Kitayama, Tokyo (JP); Masayuki Tsuneda, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/422,859

(22) Filed: Apr. 25, 2003

(65) Prior Publication Data

US 2004/0043544 A1 Mar. 4, 2004

Related U.S. Application Data

(60) Provisional application No. 60/387,489, filed on Jun. 10, 2002.

(30) Foreign Application Priority Data

Apr. 25, 2002 (JP) ........................................ 2002-124173
Mar. 10, 2003 (JP) .......................................... 2003-63337

(51) Int. Cl.[7] ...................... H01L 21/302; H01L 21/461
(52) U.S. Cl. ...................................... 438/722; 438/711
(58) Field of Search ................................ 438/722, 663, 438/679, 680, 681, 683, 685, 686, 711, 718, 905, 906, 907, 908, 913

(56) References Cited

U.S. PATENT DOCUMENTS

| 5,080,971 A | * | 1/1992 | Yokoyama et al. .......... 428/336 |
| 5,348,095 A | | 9/1994 | Worrall et al. ............... 166/380 |
| 6,112,818 A | | 9/2000 | Campbell .................... 166/384 |
| 6,162,717 A | * | 12/2000 | Yeh ............................. 438/595 |
| 6,204,203 B1 | * | 3/2001 | Narwankar et al. .......... 438/785 |
| 6,337,289 B1 | * | 1/2002 | Narwankar et al. .......... 438/776 |
| 6,425,444 B1 | | 7/2002 | Metcalfe et al. ............. 166/387 |
| 6,454,013 B1 | | 9/2002 | Metcalfe ...................... 166/382 |
| 6,457,532 B1 | | 10/2002 | Simpson ...................... 166/380 |
| 6,510,896 B2 | | 1/2003 | Bode et al. .................. 166/276 |
| 6,518,203 B2 | * | 2/2003 | Narwankar et al. .......... 438/776 |

FOREIGN PATENT DOCUMENTS

| JP | 11-217672 A | 8/1999 |
| JP | 2000-235962 A | 8/2000 |
| JP | 2001-237397 A | 8/2001 |
| WO | WO 01/18353 A1 | 3/2001 |

OTHER PUBLICATIONS

Rucker/Atlas Bradford; *Tubing String Design Manual*. World Oil; *Tubing Reference Tables 2002*; Gulf Publishing Co., 2002.

* cited by examiner

*Primary Examiner*—David Nhu
(74) *Attorney, Agent, or Firm*—Oliff & Berridge, PLC

(57) ABSTRACT

It is an object of the present invention to effectively and efficiently inhibit the influence of an eliminated gas from a built-up film deposited in a reaction chamber and reduce an incubation time to improve flatness of a thin film. A manufacturing method of a semiconductor device includes a preprocess step and a film-forming step. In the preprocess step, an RPH (Remote Plasma Hydrogenation) process of supplying a hydrogen radical onto a substrate (202), thereafter, an RPN (Remote Plasma Nitridation) process of supplying a nitrogen radical onto the substrate (203), and thereafter, an RPO (Remote Plasma Oxidation) process of supplying an oxygen radical onto the substrate (204) are performed during a substrate temperature increase for raising a substrate temperature up to a film-forming temperature. In the film-forming step, after the substrate temperature is raised up to the film-forming temperature, a film-forming process is performed by a thermal CVD method by supplying a source gas onto the substrate (205), and thereafter, the RPO process is performed (206). In this film-forming step, the film-forming source supply onto the substrate and the RPO process are preferably repeated a plurality of times.

20 Claims, 7 Drawing Sheets

MANUFACTURING METHOD OF SEMICONDUCTOR DEVICE AND SUBSTRATE PROCESSING APPARATUS

This application claims the benefit of U.S. Provisional Application No. 60/387,489, filed Jun. 10, 2002.

BACKGROUND OF THE INVENTION

1. Field of the Invention

The present invention relates to a manufacturing method of a semiconductor device and a substrate processing apparatus in which a thin film is formed over a substrate.

2. Description of the Related Art

As one of semiconductor manufacturing steps, there is a CVD (Chemical Vapor Deposition) step in which a predetermined film-forming process is applied to a surface of a substrate (a substrate to be processed formed on a base that is a silicon wafer, glass, or the like on which a fine electric circuit pattern is formed). In this step, the substrate is mounted in an airtight reaction chamber and heated by a heating unit provided in the chamber, and chemical reaction is caused while a source gas is being introduced onto the substrate, thereby forming a thin film uniformly on the fine electric circuit pattern formed on the substrate. In such a reaction chamber, a thin film is also formed on components other than the substrate. Such a thin film will be hereinafter called a built-up film. In a CVD apparatus shown in FIG. 6, a showerhead 6 and a susceptor 2 are provided in a reaction chamber 1, and a substrate 4 is mounted on the susceptor 2. A source gas is introduced into the reaction chamber 1 through a source supply pipe 5 connected to the showerhead 6 and supplied onto the substrate 4 via a number of holes 8 provided in the showerhead 6. The gas supplied onto the substrate 4 is exhausted through an exhaust pipe 7. The substrate 4 is heated by a heater 3 provided under the susceptor 2. Note that a built-up film is accumulated and deposited on components around the substrate such as the showerhead 6, the susceptor 2, and so on in accordance with increase in the number of substrates processed, in other words, increase in the number of processing times.

As such a CVD apparatus, there is a CVD apparatus that uses a MOCYD (Metal Organic Chemical Vapor Deposition) method with which an amorphous $HfO_2$ film and an amorphous Hf silicate film (they are hereinafter abbreviated to an a-HfO film), an amorphous $Ta_2O_5$ film (it is hereinafter abbreviated to an a-TaO film), and an amorphous Ru film and an amorphous $RuO_2$ film (they are hereinafter abbreviated to an a-Ru film) can be formed by using an organic chemical material as a film-forming source.

As the film-forming source, $Hf[OC(CH_3)_3]_4$ (hereinafter, abbreviated to Hf—$(OtBu)_4$), $Hf[OC(CH_3)_2CH_2OCH_3]_4$ (hereinafter, abbreviated to Hf-$(MMP)_4$ (here, MMP: 1methoxy-2-methyl-2-propoxy)), $Hf[O—Si—(CH_3)]_4$ (hereinafter, abbreviated to Hf—$(OSi)_4$), and the like are used for forming the a-HfO film; $Ta(OC_2H_5)_5$ (hereinafter, abbreviated to PETa) and the like are used for forming the a-TaO film; and $Ru(CH_2C_5H_4)_2$ (hereinafter, abbreviated to Ru(EtCp)$_2$) and the like are used for forming the a-Ru film.

Among them, many organic materials, for example, Hf—$(OtBu)_4$, Hf-$(MMP)_4$, PETa, Ru(EtCp)$_2$, and so on are in liquid phase at normal temperatures and pressures. Therefore, these organic liquid sources are heated and thus transformed to gas by vapor pressure for utilization.

[Patent Document 1]
Japanese Patent Laid-open No. 2001-237397 (pages 4 to 7, FIG. 5)

[Patent Document 2]
Japanese Patent Laid-open No. 2000-235962 (page 3, FIG. 1)

[Patent Document 3]
Japanese Patent Laid-open No. Hei 11-217672 (pages 6 to 8, FIG. 1)

The built-up film is constantly deposited in the reaction chamber of the MOCVD apparatus as described above, and $H_2$, $H_2O$, CO, $CO_2$, $CH_4$, and the like are constantly coming out as eliminated gases from this built-up film. This is because a thin film such as the a-HfO film, a-TaO-film, and a-Ru film deposited with good coverage by a conventional MOCVD method contains a large amount of C, H, OH, and the like as impurities. $H_2O$ among these eliminated gases gives an extremely significant influence to the substrate to be processed. For example, when the substrate to be processed is an Si substrate, $H_2O$ modifies the surface of the substrate to a low quality oxide or hydroxide such as Si—OH or SiOx(x<2), and consequently, turns out to be a factor of greatly lowering the properties of a semiconductor device that is an end product, which poses a big problem.

Presently, in order to avoid such a serious situation, an enormous amount of labor and expenses are spent for alleviating the adverse effect of $H_2O$ in the MOCVD reaction chamber and the adverse effect of $H_2O$ which occurs due to elimination from X—OH (X=Hf, Zr, Ta, Ru, or the like) contained in a MOCVD thin film by, for example, subjecting the surface of the Si substrate to a substrate surface modifying process such as nitridation, oxidation, oxynitridation, or CVD-TIN process in advance to form a barrier layer against $H_2O$.

The thin film deposited using the MOCVD method as described above has a disadvantage that flatness of a film surface is difficult to obtain. Especially, in the MOCVD method in the case when the thin film deposit rate is determined by surface reaction rate controlling conditions, the abovementioned problem is obvious. It is known that the thin film starts to be deposited on the substrate surface with a certain time lag in the surface reaction rate controlling conditions. This time lag is called an incubation time. During this incubation time, there is a nucleation process in which an island-shaped deposition is made on the substrate, and it is thought that the thin film loses its flatness due to the formation of irregularities in this nucleation process.

Such lack in flatness on the thin film surface becomes a cause of lowering reliability of a semiconductor device product that is an end product, and is becoming a significant problem in accordance with downsizing of the device.

SUMMARY OF THE INVENTION

It is an object of the present invention to provide a manufacturing method of a semiconductor device and a substrate processing apparatus capable of effectively and efficiently inhibiting the influence of an eliminated gas from a built-up film deposited in a reaction chamber of a MOCVD apparatus and reducing an incubation time to improve flatness of a thin film. It is another object of the present invention to provide a manufacturing method of a semiconductor device and a substrate processing apparatus capable of greatly saving an enormous amount of labor and expenses which have been conventionally spent for improving the aforesaid serious situation and simplifying a substrate surface modifying process so as to concentrate this process in a MOCVD apparatus, thereby greatly reducing production cost. It is still another object of the present invention to provide a manufacturing method of a semiconductor device and a substrate processing apparatus capable of inhibiting the influence of an eliminated gas from a built-up film deposited in a reaction chamber of a MOCVD apparatus and improving flatness of a thin film, without lowering productivity.

A first invention is a manufacturing method of a semiconductor device which is characterized in that it includes: a preprocess step of performing a preprocess to a substrate from which a natural oxide film is removed; and a film-forming step, subsequent to the preprocess step, of forming a metal thin film or a metal oxide thin film over the substrate, the preprocess step including a nitrogen preprocess step of activating a nitrogen (N)-containing gas and supplying the activated nitrogen-containing gas to the substrate and an oxygen preprocess step of activating an oxygen (O)-containing gas and supplying the activated oxygen-containing gas to the substrate. The preprocess step makes it possible to effectively and efficiently inhibit the influence of an eliminated gas from a built-up film and reduce an incubation time to improve flatness of the film formed in the film-forming step. Moreover, since the preprocess step includes the nitrogen preprocess step and the oxygen preprocess step, the quality of a semiconductor device can be enhanced compared with that when only the nitrogen preprocess or the oxygen preprocess is independently performed. To be more specific, in the preprocess including only the nitrogen preprocess (for example, a later-described RPN process), though leak current can be inhibited, an interface defect density of an end device increases to degenerate electric parameters such as flat band voltage Vfb and motility $\mu$. In the preprocess including only the oxygen preprocess (for example, a later-described RPO process), though the interface defect of the end device can be reduced, the limit of downsizing the device is lowered due to the increase in the leak current. In contrast, the present invention has both the nitrogen preprocess and the oxygen preprocess so that the abovementioned disadvantages in the independent execution of each of the processes can be mutually complemented. The nitrogen preprocess step and the oxygen preprocess step are preferably performed in this order since the effect of repairing the interface defect in the latter oxygen preprocess step is obtainable even if the interface defect occurs in the former nitrogen preprocess step.

A second invention is a manufacturing method of a semiconductor device, characterized in that it includes: a preprocess step of performing a preprocess to a substrate; and a film-forming step, subsequent to the preprocess step, of forming a metal thin film or a metal oxide thin film over the substrate, the preprocess step including a hydrogen preprocess step of activating a hydrogen (H)-containing gas and supplying the activated hydrogen-containing gas to the substrate or a chlorine preprocess step of activating a chlorine (Cl)-containing gas and supplying the activated chlorine-containing gas to the substrate, a nitrogen preprocess step of activating a nitrogen (N)-containing gas and supplying the activated nitrogen-containing gas to the substrate, and an oxygen preprocess step of activating an oxygen (O)-containing gas and supplying the activated oxygen-containing gas to the substrate; and that the preprocess step and the film-forming step are performed in one reaction chamber. A conventional preprocess for a substrate to be processed has a disadvantage that the substrate is contaminated while it is conveyed since the preprocess is performed in a different reaction chamber from that for a film-forming process. On the other hand, according to the present invention, the same reaction chamber is used for the preprocess step and the film-forming step so that the film-forming step can be performed successively immediately after the preprocess step and a substrate conveying step can be omitted, which makes it possible to prevent the substrate surface cleaned in the preprocess step from being re-contaminated while it is conveyed. In addition, production cost can be greatly reduced. Further, the execution of the preprocess step and the film-forming step in the same reaction chamber allows the conventional substrate heating time in the reaction chamber to be utilized for the preprocess, This enables efficient execution of these two processes in one reaction chamber. Moreover, since the preprocess step and the film-forming step are performed in the same reaction chamber, the film can be formed immediately after the preprocess for the substrate, which enables the formation of a high-quality interface layer.

A third invention is a manufacturing method of a semiconductor device characterized in that it includes: a preprocess step of activating a gas and supplying the activated gas to a substrate; and a film-forming step, subsequent to the preprocess step, of forming a metal thin film or a metal oxide thin film over the substrate, and that the preprocess step is performed during substrate temperature increase for raising a substrate temperature up to a film-forming temperature before a source gas is supplied in the film-forming step. When the preprocess step is performed during the temperature increase for raising the substrate temperature up to the film-forming temperature, the influence of the eliminated gas from the built-up film is inhibited and the incubation time is reduced to improve flatness of the film formed in the film-forming, without lowering productivity. In addition, the activated gas is used in the preprocess, and reliable preprocess is possible even during the temperature increase in which the temperature has not reached a processing temperature, since activation energy is larger than thermal energy.

A fourth invention is a manufacturing method of a semiconductor device characterized in that, in the first invention, in the film-forming step, a source gas supply step of supplying a source gas to the substrate and an activated gas supply step of activating a gas and supplying the activated gas after the source gas supply step are repeated a plurality of times, thereby forming a thin film having a desired film thickness. Since the source gas supply step and the activated gas supply step are repeated a plurality of times, a removal amount of impurities such as C and H in the formed film can be increased. Moreover, the repeat of the source gas supply step and the activated gas supply step (especially, the activated gas supply step) also has an effect of inhibiting the influence of the eliminated gas from the built-up film deposited in the reaction chamber.

A fifth invention is a substrate processing apparatus characterized in that it includes; a reaction chamber in which a substrate is processed; a heater heating the substrate in the reaction chamber; a source gas supply port through which a source gas is supplied into the reaction chamber; a gas activating unit activating each of a hydrogen- or chlorine-containing gas, a nitrogen-containing gas, and an oxygen-containing gas; an activated gas supply port through which the gases activated in the gas activating unit are supplied into the reaction chamber; and a control unit performing such a control operation that the activated gases are successively supplied one by one to the substrate in the reaction chamber while a temperature of the substrate heated by the heater is lower than a film-forming temperature, and performing such a control operation that the source gas used for forming a film on the substrate in the reaction chamber is supplied after the substrate temperature is raised up to the film-forming temperature and thereafter, the activated gases are supplied to the substrate.

A sixth invention is a manufacturing method of a semiconductor device characterized in that, in the first invention, the preprocess step further includes, prior to the nitrogen preprocess step and the oxygen preprocess step, a hydrogen preprocess step of activating a hydrogen (H)-containing gas and supplying the activated hydrogen-containing gas to the substrate or a chlorine preprocess step of activating a chlorine (Cl)-containing gas and supplying the activated chlorine-containing gas to the substrate. The hydrogen preprocess or the chlorine preprocess is further performed so that the substrate surface is further cleaned and thus can have a more active surface condition, thereby enabling better modification of the substrate surface in the preprocess.

A seventh invention is a manufacturing method of a semiconductor device characterized in that, in the first invention, the preprocess step and the film-forming step are performed in one reaction chamber.

An eighth invention is a manufacturing method of a semiconductor device characterized in that, in the second invention, the nitrogen preprocess step and the oxygen preprocess step are performed after the hydrogen preprocess step or the chlorine preprocess step. This processing order of the hydrogen preprocess step or the chlorine preprocess step followed by the nitrogen preprocess step and the oxygen preprocess step increases the effect of the preprocess.

A ninth invention is a manufacturing method of a semiconductor device characterized in that, in the second invention, the preprocess step is performed during a substrate temperature increase for raising a substrate temperature up to a film-forming temperature, before the source gas is supplied in the film-forming step.

A tenth invention is a manufacturing method of a semiconductor device characterized in that, in the third invention, the preprocess step includes a nitrogen preprocess step of activating a nitrogen (N)-containing gas and supplying the activated nitrogen-containing gas and an oxygen preprocess step of activating an oxygen (O)-containing gas and supplying the activated oxygen-containing gas.

An eleventh invention is a manufacturing method of a semiconductor device characterized in that, in the third invention, the preprocess step includes a hydrogen preprocess step of activating a hydrogen (H)-containing gas and supplying the activated hydrogen-containing gas or a chlorine preprocess step of activating a chlorine (Cl)-containing gas and supplying the activated chlorine-containing gas, a nitrogen preprocess step of activating a nitrogen (N)-containing gas and supplying the activated nitrogen-containing gas, and an oxygen preprocess step of activating an oxygen (O)-containing gas and supplying the activated oxygen-containing gas.

A twelfth invention is a manufacturing method of a semiconductor device or a substrate processing apparatus characterized in that, in the first invention to the eleventh invention, the gas is activated in the preprocess step by using plasma. The use of the gas activated by using the plasma can effectively and efficiently inhibit the influence of the eliminated gas from the built-up film, and reduce the incubation time to improve flatness of the thin film.

A thirteenth invention is a manufacturing method of a semiconductor device or a substrate processing apparatus characterized in that, in the first to twelfth inventions, the gas is activated in the preprocess step by using plasma in a remote plasma unit provided outside the reaction chamber in which the substrate is processed. The use of the gas activated in the remote plasma can further inhibit the influence of the eliminated gas from the built-up film effectively and efficiently, and reduce the incubation time to improve flatness of the thin film.

A fourteenth invention is a manufacturing method of a semiconductor device or a substrate processing apparatus characterized in that, in the first to thirteenth inventions, the hydrogen preprocess step is a remote plasma hydrogenation process in which the hydrogen-containing gas is activated in a remote plasma unit and the activated hydrogen-containing gas is supplied to the substrate to hydrogenate a surface of the substrate, the chlorine preprocess step is a remote plasma chlorination process in which the chlorine-containing gas is activated in the remote plasma unit and the activated chlorine-containing gas is supplied to the substrate to chlorinate the surface of the substrate, the nitrogen preprocess step is a remote plasma nitridation process in which the nitrogen-containing gas is activated in the remote plasma unit and the activated nitrogen-containing gas is supplied to the substrate to nitride the surface of the substrate, and the oxygen preprocess step is a remote plasma oxidation process in which the oxygen-containing gas is activated in the remote plasma unit and the activated oxygen-containing gas is supplied to the substrate to oxidize the surface of the substrate.

A fifteenth invention is a manufacturing method of a semiconductor device or a substrate processing apparatus characterized in that, in the first to fourteenth inventions, a source gas used in the film-forming step is an organic source gas. The use of the organic source gas in the case when flatness of the film surface is difficult to obtain and the problem of the eliminated gas occurs is especially advantageous since it can improve flatness and inhibit the influence of the eliminated gas effectively and efficiently.

A sixteenth invention is a manufacturing method of a semiconductor device or a substrate processing apparatus characterized in that, in the first to fifteenth inventions, the film-forming step has a source gas supply step of supplying a source gas to the substrate and an activated gas supply step, subsequent to the source gas supply step, of activating a gas and supplying the activated gas to the substrate, the source gas used in the film-forming step is a gas obtained by vaporizing $Hf[OC(CH_3)_2CH_2OCH_3]_4$, and the formed thin film is a film including Hf.

A seventeenth invention is a manufacturing method of a semiconductor device or a substrate processing apparatus characterized in that, in the first to fifteenth inventions, the film-forming step has a source gas supply step of supplying a source gas to the substrate and an activated gas supply step, subsequent to the source gas supply step, of activating a gas and supplying the activated gas to the substrate, the source gas used in the film-forming step is a gas obtained by vaporizing $Ta(OC_2H_5)_5$, and the formed thin film is a film including Ta.

An eighteenth invention is a manufacturing method of a semiconductor device or a substrate processing apparatus characterized in that, in the first to fifteenth inventions, the film-forming step has a source gas supply step of supplying a source gas to the substrate and an activated gas supply step, subsequent to the source gas supply step, of activating a gas and supplying the activated gas to the substrate, the source gas used in the film-forming step is a gas obtained by vaporizing any one of $Ru(C_2H_5C_5H_4)_2$ (bisethylcyclopentadienylruthenium), $Ru(C_5H_5)(C_4H_9C_5H_4)$ (buthylruthenocene), $Ru[CH_3COCHCO(CH_2)_3CH_3]_3$ (tris-2,4octanedionatoruthenium), $Ru(C_2H_5C_5H_4)((CH_3)C_5H_5)$ (2,4dimethylpentadienylethylcyclopentadienylruthenium, and $Ru(C_7H_8)(C_7H_{11}O_2)$, and the formed film is a film including Ru.

A nineteenth invention is a manufacturing method of a semiconductor device or a substrate processing apparatus characterized in that, in the first to fifteenth inventions, the film-forming step has a source gas supply step of supplying a source gas to the substrate and an activated gas supply step, subsequent to the source gas supply step, of activating a gas and supplying the activated gas to the substrate, the source gas used in the film-forming step is a gas obtained by vaporizing any one of $Ti[(OCH(CH_3)_2)]_4$, $Ti(OCH_2CH_3)_4$, $Ti[N(CH_3)_2]_4$, and $Ti[N(CH_3CH_2)_2]_4$, and the formed film is a film including Ti.

A twentieth invention is a manufacturing method of a semiconductor device or a substrate processing apparatus characterized in that, in the first to nineteenth inventions, the film-forming step has a source gas supply step of supplying a source gas to the substrate and an activated gas supply step, subsequent to the source gas supply step, of activating a gas and supplying the activated gas to the substrate, and, in the activated gas supply step, at least one kind of gas selected from a group consisting of $O_2$, $N_2O$, NO, Ar, $H_2$, $N_2$, and $NH_3$ is activated by plasma and the activated gas is supplied.

A twenty-first invention is a manufacturing method of a semiconductor device or a substrate processing apparatus characterized in that, in the first to twentieth inventions, a nitrogen preprocess step of activating a nitrogen (N) containing gas and supplying the nitrogen-containing gas and an oxygen preprocess step of activating an oxygen (O)-containing gas and supplying the oxygen-containing gas are repeated a plurality of times in the preprocess step. The preprocess step includes the nitrogen preprocess step and the oxygen preprocess step so that the, aforesaid disadvantages in the case of the independent execution of each of the processes can be mutually complemented, and especially when the nitrogen preprocess step and the oxygen preprocess step are performed in this order, the effect of repairing the interface defect in the latter oxygen preprocess step is obtainable even if the interface defect occurs in the former nitrogen preprocess step. In addition, these nitrogen preprocess step and the oxygen preprocess step are repeated a plurality of times so that the abovementioned effect obtained by one repeat can be further enhanced.

A twenty-second invention is a manufacturing method of a semiconductor device or a substrate processing apparatus characterized in that, in the first to twenty-first inventions, at least during the preprocess step, the substrate is rotated. It is preferable that the substrate is rotated at least during the preprocess step since a uniform modifying process over the surface of the substrate is made possible. Incidentally, it is preferable that the substrate is rotated both during the preprocess step and during the film-forming step, and, it is more preferable that the substrate is rotated during all the steps of the substrate surface treatment step, the preprocess step, and the film-forming step.

A twenty-third invention is a manufacturing method of a semiconductor device characterized in that it includes a preprocess step of successively supplying plural kinds of radicals selected from a hydrogen radical, a nitrogen radical, and an oxygen radical to a substrate one by one and a film-forming step of forming a metal thin film or a metal oxide thin film in an amorphous state over the substrate having undergone the preprocess step. Since the preprocess step of supplying the plural kinds of radicals successively to the substrate one by one is performed before the film-forming step, it is possible to inhibit the influence of the eliminated gas from the built-up film deposited in the reaction chamber of the MOCVD apparatus effectively and efficiently, and reduce the incubation time to improve flatness of the thin film. Further, the substrate surface modifying process as the preprocess step can be simplified to greatly save an enormous amount of labor and expenses which have been conventionally spent for a countermeasure against the eliminated gas from the built-up film, and the substrate surface modifying process can be concentrated in the MOCVD apparatus to greatly reduce production cost.

A twenty-fourth invention is a manufacturing method of a semiconductor device characterized in that, in the twenty-third invention, the preprocess step and the film-forming step are performed in one reaction chamber.

A twenty-fifth invention is a manufacturing method of a semiconductor device characterized in that, in the twenty-third or twenty-fourth invention, the film-forming step has a source gas supply step of supplying a source gas to the substrate and a radical supply step of supplying one kind of radical selected from a hydrogen radical, a nitrogen radical, and an oxygen radical after the source gas supply step, and the source gas supply step and the radical supply step are repeated a plurality of times, thereby forming the thin film having a desired film thickness. Since the source gas supply step and the radical supply step are repeated a plurality of times, the thin film having a predetermined film thickness can be formed and a removal amount of impurities such as C and H in the formed film can be increased. Moreover, the repeat of the source gas supply step and the radical supply step (especially, the radical supply step) also has an effect of inhibiting the influence of the eliminated gas from the built-up film deposited in the reaction chamber of the MOCVD apparatus.

A twenty-sixth invention is a manufacturing method of a semiconductor device characterized in that, in the twenty-fourth or twenty-fifth invention, the preprocess step is performed during a substrate temperature increase for raising a substrate temperature up to a film-forming temperature, before the source gas supply in the film-forming step.

A twenty-seventh invention is a substrate processing apparatus characterized in that it includes: a reaction chamber in which a substrate is processed; a heater heating the substrate in the reaction chamber; a source gas supply port through which a source gas is supplied into the reaction chamber; a radical generating unit capable of generating plural kinds of radicals selected from a hydrogen radical, a nitrogen radical, and an oxygen radical; a radical supply port through which the radical generated in the radical generating unit is supplied into the reaction chamber; and a control unit performing such a control operation that the plural kinds of radicals are successively supplied to the substrate in the reaction chamber one by one, while a temperature of the substrate heated by the heater is lower than a film-forming temperature, and performing such a control operation that the source gas is supplied to the substrate in the reaction chamber after the substrate temperature is raised up to the film-forming temperature and thereafter, one kind of radical selected from the hydrogen radical, the nitrogen radical, and the oxygen radical is supplied to the substrate.

The control unit is provided that performs such a control operation that the substrate is heated by the heater, the plural kinds of radicals selected from the hydrogen radical, the nitrogen radical, and the oxygen radical are successively supplied to the substrate in the reaction chamber one by one while the substrate temperature is lower than the film-forming temperature, and such a control operation that the source gas is supplied to the substrate in the reaction chamber after the substrate temperature is raised up to the film-forming temperature and thereafter, one kind of radical selected from the hydrogen radical, the nitrogen radical, and the oxygen radical is supplied, so that the manufacturing method of the semiconductor device according to the twenty-fourth invention can be easily executed. Incidentally, when a control unit is further provided that performs such a control operation that the source gas is supplied to the substrate in the reaction chamber after the substrate temperature is raised up to the film-forming temperature, thereafter one kind of radical selected from the hydrogen radical, the nitrogen radical, and the oxygen radical is supplied, and the source gas supply and the radical supply are repeated a plurality of times, the manufacturing method of the semiconductor device according to the twenty-fifth invention can be easily executed. Incidentally, when a control unit is further provided that performs such a control operation that the plural kinds of radicals are supplied successively to the substrate in the reaction chamber one by one during the substrate temperature increase, the manufacturing method of the semiconductor device according to the twenty-sixth invention can be easily executed.

A twenty-eighth invention is a manufacturing method of a semiconductor device or a substrate processing apparatus characterized in that, in the twenty-third to twenty-seventh inventions, the plural kinds of radicals are generated in such a manner that plural kinds of gases selected from a gas including hydrogen atoms, a gas including nitrogen atoms, and a gas including oxygen atoms are activated using plasma in a remote plasma unit provided outside the reaction chamber in which the substrate is processed, The use of especially the radicals activated in the remote plasma, among radicals, can inhibit the influence of the eliminated gas from the built-up film effectively and efficiently, and reduce the incubation time to improve flatness of the thin film.

A twenty-ninth invention is a manufacturing method of a semiconductor device or a substrate processing apparatus characterized in that, in the twenty-eighth invention, the preprocess step is a process in which plural kinds of remote plasma processes are applied to the substrate successively one by one, the plural kinds of remote plasma processes being selected from a remote plasma hydrogenation process in which a substrate surface is hydrogenated using the hydrogen radical generated by activating a hydrogen-containing gas in the remote plasma unit, a remote plasma nitridation process in which the substrate surface is nitrided using the nitrogen radical generated by activating a nitrogen-containing gas in the remote plasma unit, and a remote plasma oxidation process in which the substrate surface is oxidized using the oxygen radical generated by activating an oxygen-containing gas in the remote plasma unit. Especially, the plural kinds of processes, among remote plasma processes, selected from the remote plasma hydrogenation process, the remote plasma nitridation process, and the remote plasma oxidation process are performed successively, so that the influence of the eliminated gas from the built-up film can be inhibited effectively and efficiently, and the incubation time can be reduced to improve flatness of the thin film.

A thirtieth invention is a manufacturing method of a semiconductor device or a substrate processing apparatus characterized in that, in the twenty-ninth invention, the preprocess step is a process in which the remote plasma hydrogenation process, the remote plasma nitridation process, and the remote plasma oxidation process are performed successively in this order. Especially when the remote plasma hydrogenation process, the remote plasma nitridation process, and the remote plasma oxidation process are all performed successively in this order, the abovementioned effects are prominent.

A thirty-first invention is a manufacturing method of a semiconductor device or a substrate processing apparatus characterized in that, in the twenty-third to thirtieth inventions, the source gas used in the film-forming step is an organic source gas.

A thirty-second invention is a manufacturing method of a semiconductor device or a substrate processing apparatus characterized in that, in the thirty-first invention, the film-forming step has a source gas supply step of supplying a source gas to the substrate and a radical supply step of supplying a radical after the source gas is supplied, the source gas used in the film-forming step is a gas obtained by vaporizing $Hf[OC(CH_3)_2CH_2OCH_3]_4$, the radical supplied thereafter is an oxygen radical, and the formed thin film is a $HfO_2$ film.

A thirty-third invention is a manufacturing method of a semiconductor device or a substrate processing apparatus characterized in that, in the thirty-first invention, the film-forming step has a source gas supply step of supplying a source gas to the substrate and a radical supply step of supplying a radical after the source gas is supplied, the source gas used in the film-forming step is a gas obtained by vaporizing $Ta(OC_5H_5)_5$, the radical supplied thereafter is an oxygen radical, and the formed thin film is a $Ta_2O_5$ film.

A thirty-fourth invention is a manufacturing method of a semiconductor device or a substrate processing apparatus characterized in that, in the thirty-first invention, the film-forming step has a source gas supply step of supplying a source gas to the substrate and a radical supply step of supplying a radical after the source gas is supplied, the source gas used in the film-forming step is a gas obtained by vaporizing $Ru(C_2H_5C_5H_4)_2$, the radical supplied thereafter is a hydrogen radical or an oxygen radical, and the formed thin film is an Ru film or an $RuO_2$ film.

A thirty-fifth invention is a manufacturing method of a semiconductor device or a substrate processing apparatus characterized in that, in the thirty-first invention, the film-forming step has a source gas supply step of supplying a source gas to the substrate and a radical supply step of supplying a radical after the source gas is supplied, the source gas used in the film-forming step is a gas obtained by vaporizing $Ti(N(CH_3)_2)_4$, the radical supplied thereafter is a nitrogen radical, and the formed thin film is a TiN film.

A thirty-sixth invention is a manufacturing method of a semiconductor device or a substrate processing apparatus characterized in that, in the twenty-third to thirty-fifth inventions, it further includes a substrate surface treatment step of removing a natural oxide film and a contaminant on the substrate surface before the preprocess step.

A thirty-seventh invention is a manufacturing method of a semiconductor device or a substrate processing apparatus characterized in that, in the thirty-sixth invention, the substrate surface treatment step, the preprocess step, and the film-forming step are performed in the same reaction chamber.

A thirty-eighth invention is a manufacturing method of a semiconductor device or a substrate processing apparatus characterized in that, in the thirty-sixth or thirty-seventh invention, the substrate surface treatment step is a remote plasma dry cleaning process of supplying the substrate in the reaction chamber with a radical generated by activating a cleaning gas using plasma in a remote plasma unit provided outside the reaction chamber in which the substrate is processed, thereby removing the natural oxide film formed on the substrate surface or a metal contaminant.

A thirty-ninth invention is a manufacturing method of a semiconductor device or a substrate processing apparatus characterized in that, in the twenty-third to thirty-eighth inventions, the substrate is rotated at least during the pre-process step.

DETAILED DESCRIPTION OF THE PREFERRED EMBODIMENTS

Hereinafter, an embodiment of the present invention will be explained. In this embodiment, the explanation will be given on the case where an amorphous $HfO_2$ film (hereinafter, simply abbreviated to an $HfO_2$ film) is formed by a MOCVD method.

Figure 4:
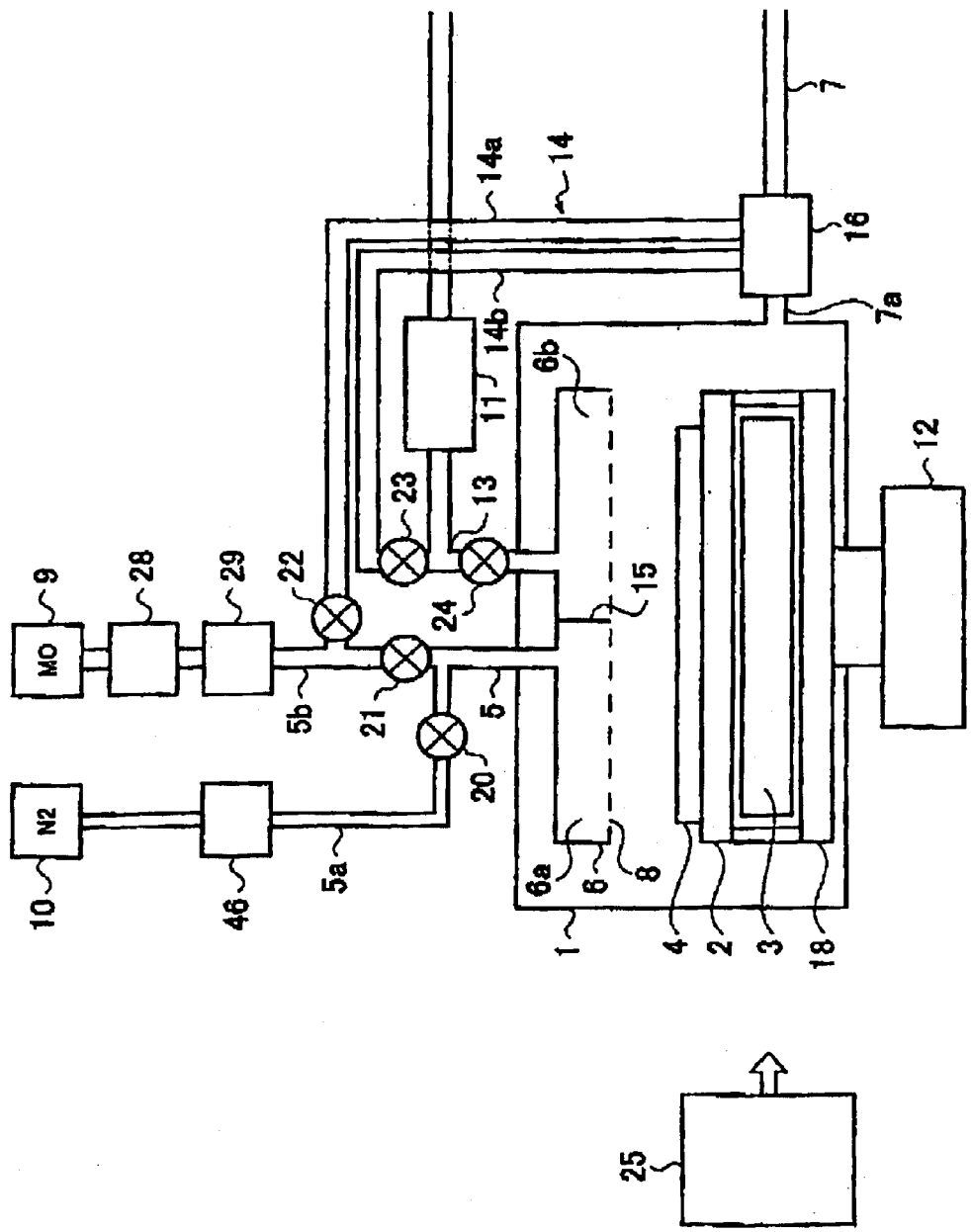
FIG. 4 is a schematic explanatory diagram of a reaction chamber according to the embodiment.
Figure 6:
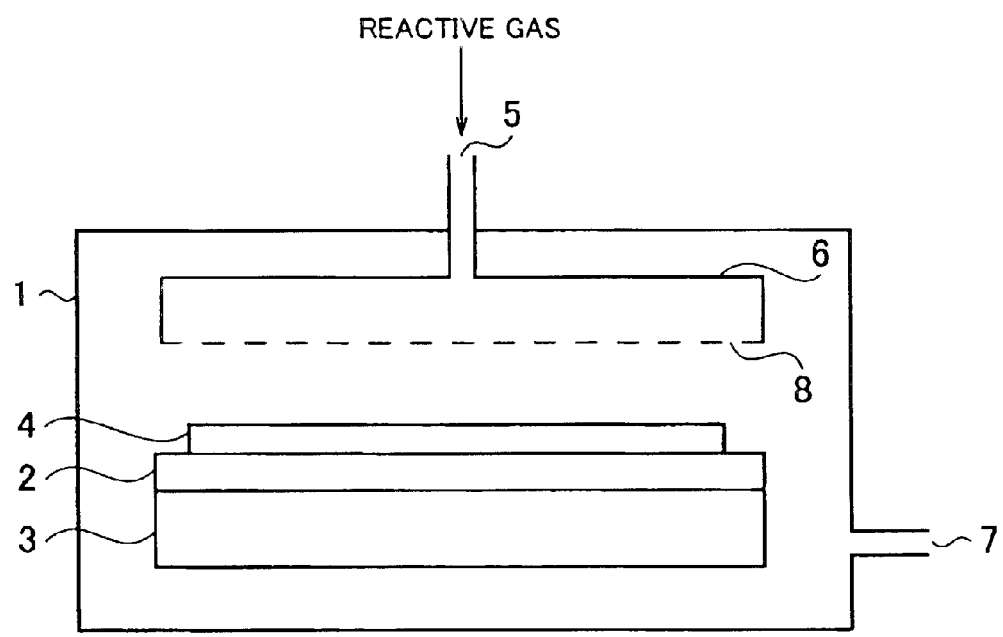
FIG. 6 is a conceptual explanatory view of a CVD reaction chamber of the conventional example.

FIG. 4 is a schematic diagram showing an example of a single wafer type MOCVD apparatus that is a substrate processing apparatus according to the embodiment. A radical generating unit 11, a substrate rotating unit 12, an inert gas supply unit 10, and a bypass pipe 14 are mainly added to a conventional reaction chamber 1 (FIG. 6).

A hollow heater unit 18 whose upper opening is covered with a susceptor 2 is provided in the reaction chamber 1 as shown in FIG. 4. A heater 3 is provided in the heater unit 18 and the heater 3 is intended for heating a substrate 4 mounted on the susceptor 2 to a predetermined temperature. The substrate 4 mounted on the susceptor 2 is, for example, a semiconductor silicon wafer, a glass substrate, or the like.

The substrate rotating unit 12 is provided outside the reaction chamber 1, and the substrate 4 on the susceptor 2 is capable of rotating when the substrate rotating unit 12 rotates the heater unit 18 in the reaction chamber 1. The substrate 4 is rotated so that radicals introduced from a radical generating unit 11, a source gas introduced from a film-forming source supply unit 9, and an inert gas introduced from an inert gas supply unit 10, all of which will be described later, are supplied uniformly over a surface of the substrate 4. By this rotation, in a preprocess step which will be described later, an oxygen radical, a nitrogen radical, and a hydrogen radical can be supplied uniformly over the surface of the substrate 4 so that the uniform preprocess over the surface of the substrate 4 is possible. Further, in a film-forming step which will be described later, the source gas can be supplied uniformly over the surface of the substrate 4, which allows uniform formation of a thin film layer over the surface of the substrate, and in addition, the oxygen radical can be supplied uniformly over a surface of the thin film layer formed over the substrate 4, which makes it possible to remove impurities such as C and H in the formed thin film quickly and uniformly over the surface of the substrate.

A showerhead 6 having a number of holes 8 is provided above the susceptor 2 in the reaction chamber 1. The showerhead 6 is divided into a film-forming showerhead portion 6a and a radical showerhead portion 6b by a partition plate 15, thereby allowing gases to be injected in a shower separately from the divided showerhead portions 6a and 6b.

A film-forming source supply unit 9 supplying an organic liquid source as a film-forming source, a liquid flow rate controller 28 as a flow rate control means controlling a liquid supply flow rate of the film-forming source, and a vaporizer 29 vaporizing the film-forming source are provided outside the reaction chamber 1. An inert gas supply unit 10 supplying an inert gas as a non-reactive gas and a mass flow controller 46 as a flow rate control means controlling a flow rate of supplying the inert gas are provided. An organic material such as $Hf\text{-}(MMP)_4$ is used as the source gas. Ar, He, $N_2$ or the like is used as the inert gas. A source gas supply pipe 5b provided to the film-forming source supply unit 9 and an inert gas supply pipe 5a provided to the inert gas supply unit 10 are integrated and communicate with a source supply pipe 5 connected to the film-forming showerhead portion 6a.

The source supply pipe 5 is configured to supply a mixed gas of the source gas and the inert gas to the film-forming showerhead portion 6a of the showerhead 6 in the film-forming step of forming the $HfO_2$ film over the substrate 4. The source gas supply pipe 5b and the inert gas supply pipe 5a are provided with valves 21 and 20 respectively, and by opening/closing these valves 21 and 20, it is possible to control the supply of the mixed gas of the source gas and the inert gas.

The radical generating unit 11 generating the radicals is also provided outside the reaction chamber 1. The radical generating unit 11 is constituted by, for example, a remote plasma unit. A radical supply pipe 13 connected to the radical shower head portion 6b is provided on a downstream side of the radical generating unit 11 so that an oxygen radical, a nitrogen radical, a hydrogen radical, or a chlorine radical is supplied in the preprocess step, an oxygen radical in the film-forming step, or a chlorine fluoride radical in a cleaning step, respectively, to the radical showerhead portion 6b of the showerhead 6. The radical supply pipe 13 is provided with a valve 24 so that the supply of the radicals is controllable by opening/closing the valve 24. Incidentally, this radical generating unit 11 constitutes a gas activating unit of the present invention.

The radical generating unit 11 activates gases to generate the radicals and supplies the generated radicals into the reaction chamber 1 in the preprocess step, the film-forming step, and the cleaning step respectively. The radical used in the preprocess step is preferably an oxygen radical, a nitrogen radical, a hydrogen radical, or a chlorine radical. Any one of these radicals may be selected and supplied, the plural kinds of radicals may be selected from these radicals and supplied successively one by one, or all of these radicals may be successively supplied one by one. The radical used in the film-forming step is preferably, for example, an oxygen radical when the organic material such as $Hf\text{-}(MMP)_4$ is used as the source. This is because a removing process of impurities such as C and H can be performed efficiently immediately after the formation of the $HfO_2$ film. Incidentally, in forming a $Ta_2O_5$ film using PETa as the source, for example, an oxygen radical is preferable, in forming an Ru film or an $RuO_2$ film using $Ru(EtCp)_2$, a hydrogen radical or an oxygen radical (especially a hydrogen radical) is preferable, and in forming a TiN film using $Ti(N(CH_3)_2)_4$, a nitrogen radical is preferable. A radical used in the cleaning step of removing a built-up film formed also on components other than the substrate is preferably a ClF$_3$ radical.

To an upstream side of the radical generating unit 11, connected are an oxygen-containing gas supply unit supplying a gas including oxygen atoms (for example, O$_2$, NO, N$_2$O, or the like), a nitrogen-containing gas supply unit supplying a gas including nitrogen atoms (for example, N$_2$, NH$_3$, or the like), a hydrogen-containing gas supply unit supplying a gas including hydrogen atoms (for example, H$_2$ or the like), and a chlorine-containing gas supply unit supplying a gas including chlorine atoms (for example, ClF$_3$, Cl$_2$, or the like), all of the gases being supplied via a gas supply system, so that the oxygen-containing gas, the nitrogen-containing gas, the hydrogen-containing gas, or the chlorine-containing gas (Cl$_2$ or the like) used in the preprocess step, the oxygen-containing gas (the hydrogen-containing gas or the oxygen-containing gas for forming the Ru film and the nitrogen-containing gas for forming the TiN film) used in impurity removal in the film-forming step, and the chlorine-containing gas (ClF$_3$ or the like) used in the cleaning step can be selectively supplied to the radical generating unit 11.

Figure 5A:
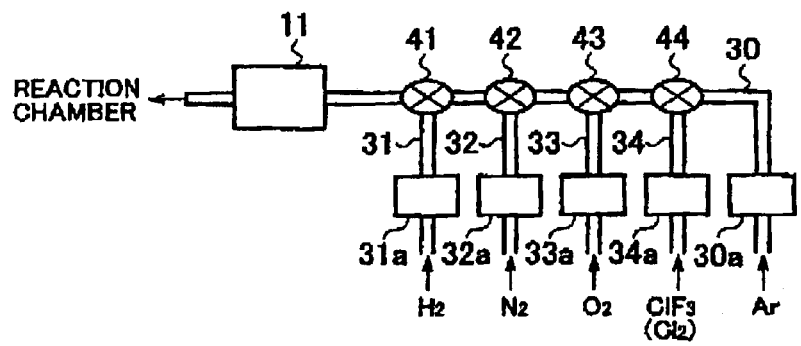
FIG. 5A and FIG. 5B are views each showing a configuration example of an upstream side of a radical generating unit in FIG. 4.

Specifically, as shown in FIG. 5A, a main line 30 through which a plasma generating gas (for example, an inert gas such as Ar) is supplied to the radical generating unit 11 is connected to the upstream side of the radical generating unit 11, and a supply line 31 of an H$_2$ gas as the hydrogen-containing gas, a supply line 32 of an N$_2$ gas as the nitrogen-containing gas, a supply line 33 of an O$_2$ gas as the oxygen-containing gas, and a supply line 34 of a ClF$_3$ (Cl$_2$) gas as the chlorine-containing gas are connected to this main line 30.

At connection portions between the main line 30 and the respective gas supply lines 31, 32, 33, and 34, valves 41, 42, 43, and 44 are provided respectively, and ON/OFF changeover of the supply of each of the aforesaid gases to the radical generating unit 11 is made possible by opening/closing each of these valves. Incidentally, the opening/closing of these valves 41 to 44 is controlled by a controller 25.

Further, MFCs 31a, 32a, 33a, and 34a are provided as flow rate control means in the abovementioned lines 31, 32, 33, and 34 respectively so that the gas supply amount from each of these lines can be controlled, Further, the flow rate of an Ar gas flowing through the main line can be also controlled by an MFC 30a.

With the structure as described above, any one or more of a hydrogen, nitrogen, oxygen, chlorine (chlorine compound: for example, ClF$_3$ or the like), and argon radical can be selectively supplied to the substrate 4 from the radical generating unit 11. This allows later-described RPH, RPN, RPO, and RPCl processes to be performed as the preprocess immediately before the substrate 4 is subjected to a MOCVD process. Further, a CVD process can be performed by repeating the MOCVD process and the RPX process (X=H, N, O, and Cl). In addition, the use of the ClF$_3$ radical enables a self-cleaning process of the reaction chamber 1 under the temperature of 300° C. or lower. Further, it is preferable to use, for example, Ar as the plasma generating gas since the use of Ar allows stable plasma generation in the radical generating unit 11.

Moreover, since the RPX processes (X=H, N, O, and Cl) are performed using the same radical generating chamber in one radical generating unit 11 and the aforesaid gases are changed over by the valves 41 to 44, the apparatus configuration need not be complicated nor upsized.

Figure 5B:
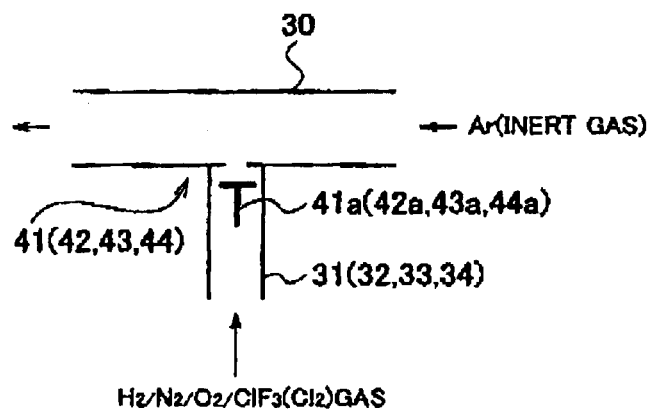

FIG. 5B is an enlarged view of a surrounding area of the valve 41 (42, 43, 44) provided at the connection portion between the main line 30 and the aforesaid gas supply line 31 (32, 33, 34). As is shown, a valve disc 41a (42a, 43a, 44a) in the valve 41 (42, 43, 44) is disposed on an H$_2$ gas (N$_2$ gas, O$_2$ gas, ClF$_3$ (Cl$_2$) gas) supply side in the corresponding gas supply line 31 (32, 33, 34), so that the supply of each of the H$_2$ gas, N$_2$ gas, O$_2$ gas, ClF$_3$ (Cl$_2$) gas can be started/stopped quickly while the Ar gas flowing through the main line is kept supplied. Incidentally, three-way valves are also usable as the valves 41 to 44.

The film-forming showerhead portion 6a and the radical showerhead portion 6b including the source supply pipe 5, the radical supply pipe 13, and so on provided to the reaction chamber 1 constitute separate supply ports from which the source gas to be supplied to the substrate 4 and the radicals to be supplied to the substrate 4 are supplied respectively. The supply port including the film-forming showerhead portion 6a is a source gas supply port, and the supply port including the radical showerhead portion 6b is an activated gas supply port (radical supply port).

An exhaust port 7a from which the inside of the reaction chamber is exhausted is provided in the reaction chamber 1, and the exhaust port 7a is connected to an exhaust pipe 7 which communicates with an exhaust pump and an eliminating apparatus which are not shown. A source recovery trap 16 which recovers the source gas is provided in the exhaust pipe 7, This source recovery trap 16 is used in common in the preprocess step, the film-forming step, and the cleaning step. The exhaust port 7a and the exhaust pipe 7 constitute an exhaust system.

A source gas bypass pipe 14a and a radical bypass pipe 14b (these are referred to simply as a bypass pipe 14) connected to the source recovery trap 16 which is provided in the exhaust pipe 7 are attached to the source gas supply pipe 5b and the radical supply pipe 13 respectively. The source gas bypass pipe 14a and the radical bypass pipe 14b are provided with valves 22 and 23 respectively. By using this structure, when the source gas is supplied onto the substrate 4 in the reaction chamber 1, the supply of the radical is not stopped and the radical is exhausted through the radial bypass pipe 14b and the source recovery trap 16 so as to bypass the reaction chamber 1. When the radical is supplied onto the substrate 4 in the reaction chamber 1, the supply of the source gas is not stopped and the source gas is exhausted through the source gas bypass pipe 14a and the source recovery trap 16 so as to bypass the reaction chamber 1. In short, neither the supply of the source gas from the film-forming source supply unit 9 nor the supply of the radical from the radical generating unit 11 is stopped and the source gas and the radical are constantly kept flowing at least during the substrate processing.

The controller 25 which controls the opening/closing and the like of the valves 20 to 24 is provided. The controller 25 performs such a control operation, for example, that the heater heats the substrate 4, raises the temperature of the substrate up to a film-forming temperature at a predetermined rate, and keeps the film-forming temperature after the substrate temperature is raised. In the preprocess step, the controller 25 also performs such a control operation that the plural kinds of radicals selected from the hydrogen radical, nitrogen radical, and oxygen radical are successively supplied one by one, onto the substrate 4 from the radical showerhead portion 6b while the substrate temperature is lower than the film-forming temperature (for example, during a substrate temperature increase period). For example, the control is performed in such a manner that the hydrogen radical, the nitrogen radical, and the oxygen radical are successively supplied in this order. Then, after the substrate temperature is raised up to the film-forming temperature, the controller 25 performs such a control operation that the source gas is supplied onto the substrate 4 from the film-forming showerhead portion 6a to form the film, and thereafter, the oxygen radical (the hydrogen radical or the oxygen radical for forming the Ru film and the nitrogen radical for forming the TiN film) is supplied to the formed thin film. The controller 25 then controls the supply of the source gas and the supply of the oxygen radical (the hydrogen radical or the oxygen radical in the Ru film formation and the nitrogen radical in the TiN film formation) onto the substrate 4 to be repeated a plurality of time. During this period, the control is performed in such a manner that the inside of the reaction chamber 1 is constantly exhausted from the exhaust port 7a. The controller 25 also performs such a control operation that the inert gas (Ar, He, $N_2$, or the like) is further supplied between the supply of the source gas and the supply of the oxygen radical.

Next, description will be given on a procedure for forming an $HfO_2$ film exhibiting good flatness, using the aforesaid substrate processing apparatus as structured in FIG. 4, through the use of a different process from a conventional process by effectively and efficiently inhibiting the influence of the eliminated gas from the built-up film which is deposited in the MOCVD reaction chamber and by controlling the incubation time.

Figure 1:
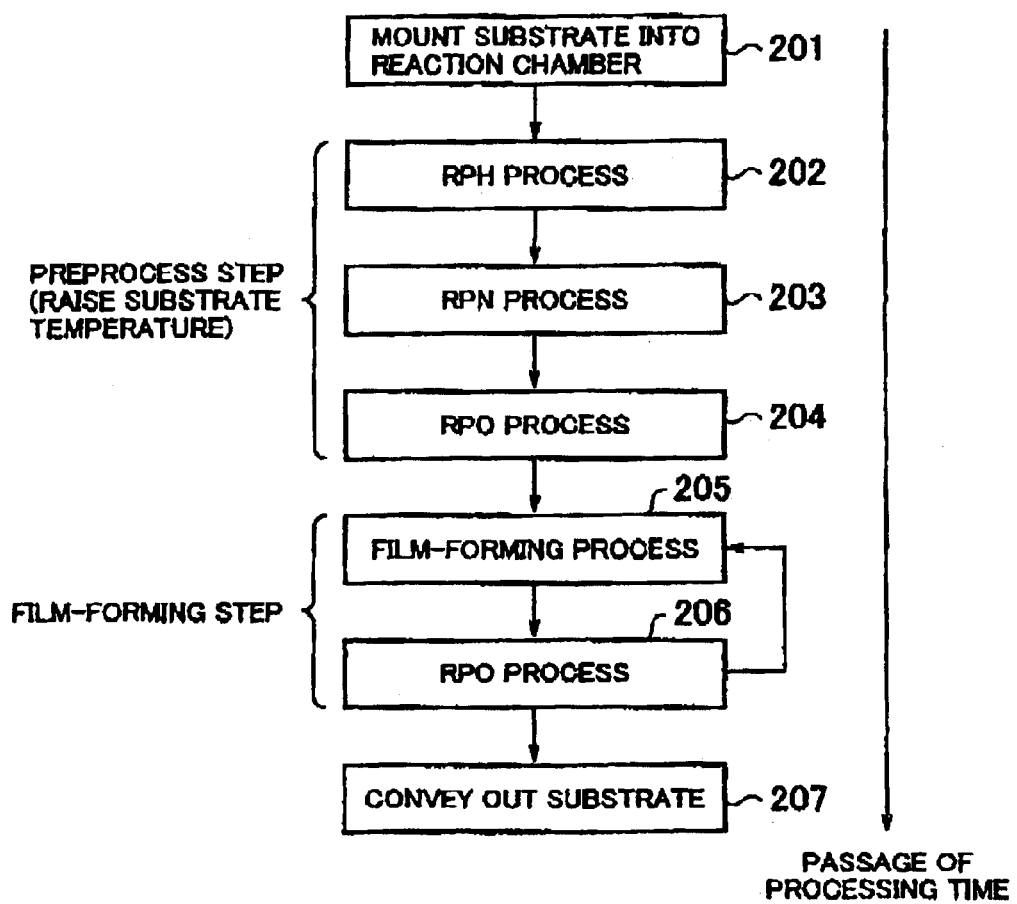
FIG. 1 is a process flow chart according to an embodiment.

A process flow of a first embodiment is shown in FIG. 1. Before the substrate 4 is mounted in the reaction chamber 1, only the valve 20 is opened to cause only the $N_2$ gas that is the inert gas to flow into the reaction chamber 1 at 1 to 5 slm. Thereafter, the substrate 4 whose surface has undergone the cleaning process corresponding to RCA cleaning is inserted into the reaction chamber 1 to be mounted on the susceptor 2, and while the substrate 4 is being rotated by the substrate rotating unit 12, power is supplied to the heater 3 to start to raise the substrate temperature in order to uniformly heat the substrate 4 up to 350° C. to 500° C. that is the film-forming temperature (Step 201). Incidentally, the film-forming temperature depends on reactivity of the organic material in use, and for example, when Hf-$(MMP)_4$ is used, the film-forming temperature is preferably in the range of 390° C. to 440° C. In addition, it is possible to prevent particles and metal contaminants from adhering to the substrate 4 when the valve 20 provided in the inert gas supply pipe 5a is opened to constantly keep the inert gas such as Ar, He, or $N_2$ flowing at least when the substrate 4 is in the reaction chamber 1, that is, when the substrate 4 is conveyed, when the substrate 4 is heated (including when the substrate 4 is heated during the substrate temperature increase and the film-formation), and the like. Incidentally, it is more preferable that the inert gas is constantly kept flowing also when the substrate 4 is not in the reaction chamber 1, that is, before the substrate 4 is conveyed into the reaction chamber 1, after the substrate 4 is conveyed out of the reaction chamber 1, and the like.

In a conventional method, the inert gas (such as $N_2$) is simply supplied onto the substrate 4 during this substrate temperature increase. In this embodiment, on the other hand, the preprocess step is started while the substrate temperature is lower than the film-forming temperature after the increase of the substrate temperature is started. The preprocess step means a step in which the substrate surface which is to be a base of the formed film is modified by plural kinds of remote plasma processes before the film is formed, and to be more specific, it is a step in which plural kinds of processes selected from an RPH (Remote Plasma Hydrogenation) process, an RPCl (Remote Plasma Chlorination) process, an RPN (Remote Plasma Nitridation) process, and an RPO (Remote Plasma Oxidation) process are successively performed one by one.

Here, the PRH process is a remote plasma hydrogenation process in which the substrate in the reaction chamber 1 is supplied with the hydrogen radical which is generated by activating the hydrogen-containing gas ($H_2$ or the like) using plasma in the remote plasma unit provided outside the reaction chamber 1, thereby hydrogenating the substrate surface, the RPCl process is a remote plasma chlorination process in which the substrate in the reaction chamber 1 is supplied with the chlorine radical which is generated by activating the chlorine-containing gas ($Cl_2$ or the like) using plasma in the remote plasma unit provided outside the reaction chamber 1, thereby chlorinating the substrate surface, the RPN process is a remote plasma nitridation process in which the substrate in the reaction chamber 1 is supplied with the nitrogen radical which is generated by activating the nitrogen-containing gas ($N_2$, $NH_3$, or the like) using plasma in the remote plasma unit provided outside the reaction chamber 1, thereby nitriding the substrate surface, and the RPO process is a remote plasma oxidation process in which the substrate in the reaction chamber 1 is supplied with the oxygen radical which is generated by activating the oxygen-containing gas ($O_2$, $N_2O$, NO, or the like) using plasma in the remote plasma unit provided outside the reaction chamber 1, thereby oxidizing the substrate surface. Incidentally, the radical generating unit 11 corresponds to the remote plasma unit in which each of the gases is activated by plasma.

It can be considered to perform any one process (for example, only the RPH process or the like) selected from these remote plasma processes (the RPH process, the RPCl process, the RPN process, and the RPO process) as the preprocess, but it is preferable that the plural kinds of processes are selected from these processes and performed successively one by one. For example, two kinds of the processes may be selected to be performed successively one by one (for example, RPN process→RPO process, or the like), or all of three kinds of the processes may be selected to be performed successively one by one (for example, RPN process→RPO process→RPH process, or the like). Selecting all (three kinds) of the processes to perform these processes successively is more preferable (for example, RPH process →RPO process→RPN process, or the like). Hereinafter, the explanation will be given on the case when the RPH process, the RPN process, and the RPO process are successively performed in this order as the preprocess step during the substrate temperature increase.

In the RPH process, the valve 24 is opened to supply the hydrogen radical onto the substrate 4 from the radical generating unit 11 (remote plasma unit) during the substrate temperature increase. Incidentally, the radical generating unit 11 is supplied with the hydrogen-containing gas (here, an $H_2$/Ar mixed gas) in advance by opening the valve 41 (refer to FIG. 5A) and the hydrogen-containing gas is activated to produce the state in which the hydrogen radical is generated therein. The hydrogen radical is introduced to the radical showerhead portion 6b through the radical supply pipe 13 and supplied onto the substrate 4 on the susceptor 2 in a shower via a number of the holes 8. Thereafter, the valve 24 is closed and the valve 23 is opened to exhaust the hydrogen radical through the bypass pipe 14b so that the supply of the hydrogen radical onto the substrate 4 is stopped. This completes the RPH process of supplying the hydrogen radical onto the substrate 4 (Step 202).

This RPH process is capable of deoxidizing contaminants such as impurities which may possibly adhere to the substrate surface and removing contaminants such as $H_2O$ adhering onto the surface substrate so that the substrate surface can be cleaned to have an active surface state. It is also capable of producing the state in which the substrate surface is terminated with hydrogen to increase bonding strength between the substrate 4 and a subsequently deposited film so that adhesiveness therebetween can be improved. It is inferred that the adhesiveness between the film and the substrate 4 is improved because the presence of hydrogen when the film and the substrate 4 are bonded on an atomic level easily causes bonding even in the state with a relatively low energy. Incidentally, after the RPH process is finished, the valve 24 provided in the radical supply pipe 13 is closed and the valve 23 provided in the radical bypass pipe 14b is opened so that the radical supplied from the radical supply unit 11 is exhausted through the radical bypass pipe 14b so as to bypass the reaction chamber 1, and therefore, the supply of the radical is not stopped.

Incidentally, the execution of the RPCl process instead of the RPH process in Step 202 is also effective. The RPCl process is, as described above, the remote plasma chlorination process in which the substrate in the reaction chamber 1 is supplied with the chlorine radical which is generated by activating the chlorine-containing gas ($Cl_2$ or the like) using plasma in the remote plasma unit provided outside the reaction chamber 1, thereby chlorinating the substrate surface. In the RPCl process, the radical generating unit 11 is supplied, with the chlorine-containing gas (here, a $Cl_2$/Ar mixed gas) in advance by opening the valve 44 (refer to FIG. 5A) so that the state in which the chlorine radical is generated therein is produced.

During this RPH process (or RPCl process) and the subsequent RPN process, the valve 20 provided in the inert gas supply pipe 5a is left open to constantly keep the inert gas such as $N_2$ flowing. After the RPH process is finished, the gas to be supplied to the radical generating unit 11 is changed over to the nitrogen-containing gas from the hydrogen-containing gas before the subsequent RPN process. In the radical generating unit 11, the state in which the nitrogen radical is generated therein is produced by activating the nitrogen-containing gas in advance, and the generated nitrogen radical is exhausted through the radical bypass pipe 14b so as to bypass the reaction chamber 1.

The RPN process (Step 203) follows the RPH process (Step 202). In the RPN process, similarly to the RPH process, the valve 24 is kept open during the substrate temperature increase and the nitrogen radical is supplied onto the substrate 4 from the radical generating unit 11. Incidentally, the radical generating unit 11 is supplied with the nitrogen-containing gas (here, an $N_2$/Ar mixed gas) in advance by opening the valve 42 (refer to FIG. 5A) to produce the state in which the nitrogen radical is generated therein by activating the nitrogen-containing gas. The nitrogen radical is introduced to the radical showerhead portion 6b through the radical supply pipe 13 and supplied onto the substrate 4 on the susceptor 2 in a shower via a number of the holes 8. Thereafter, the valve 24 is closed and the valve 23 is opened to exhaust the nitrogen radical through the bypass pipe 14b so that the supply of the nitrogen radical onto the substrate 4 is stopped. This completes the RPN process of supplying the nitrogen radical onto the substrate 4 (Step 203). It is expected that this RPN process has an effect of improving an insulating property of an insulation film when the end device is the is insulation film such as $HfO_2$, an effect of preventing recontamination of the cleaned substrate surface, an effect of reducing the incubation time in the film-forming step, and so on. Incidentally, after the RPN process is finished, the valve 24 provided in the radical supply pipe 13 is closed and the valve 23 provided in the radical bypass pipe 14b is opened so that the radical supplied from the radical supply unit 11 is exhausted through the radical bypass pipe 14b so as to bypass the reaction chamber 1, and therefore, the supply of the radical is not stopped.

During this RPN process and the subsequent RPO process, the valve 20 provided in the inert gas supply pipe Sa is left open and the inert gas such as $N_2$ is constantly kept flowing. Further, after the RPN process, the gas to be supplied to the radical generating unit 11 is changed over to the oxygen-containing gas from the nitrogen-containing gas before the subsequent RPO process, the oxygen-containing gas is activated in the radical generating unit 11 to produce the state in which the oxygen radical is generated therein, and the generated oxygen radical is exhausted through the radical bypass pipe 14b so as to bypass the reaction chamber 1.

The RPO process (Step 204) follows the RPN process (Step 203). In the RPO process, similarly to the RPN process, the valve 24 is kept open during the substrate temperature increase to supply the oxygen radical onto the substrate 4 from the radical generating unit 11. Incidentally, the radical generating unit 11 is supplied with the oxygen-containing gas (here, an $O_2$/Ar mixed gas) in advance by opening the valve 43 (refer to FIG. 5A) to produce the state in which the oxygen radical is generated therein by activating the oxygen-containing gas. The oxygen radical is introduced to the radical showerhead portion 6b through the radical supply pipe 13 and supplied onto the substrate 4 on the susceptor 2 in a shower via a number of the holes 8. Thereafter, the valve 24 is closed and the valve 23 is opened to exhaust the oxygen radical through the bypass pipe 14b so that the supply of the oxygen radical onto the substrate 4 is stopped. This completes the RPO process of supplying the oxygen radical onto the substrate 4 (Step 204). This RPO process is capable of removing contaminants such as impurities which may possibly adhere to the substrate surface and removing contaminants such as $H_2O$ adhering to the substrate surface so that the substrate surface can be cleaned. Further, it is expected that this RPO process has an effect of repairing an interface defect caused by the prior proms (RPN process). Incidentally, after the RPO process is finished, the valve 24 provided in the radical supply pipe 13 is closed and the valve 23 provided in the radical bypass pipe 14b is opened so that the radical supplied from the radical supply unit 11 is exhausted through the radical bypass pipe 14b so as to bypass the reaction chamber 1, and therefore, the supply of the radical is not stopped. After the oxygen radical is generated in the RPO process as the preprocess step, the supply of the oxygen radical is not stopped until the film-forming step is started or is not stopped during the film-forming step either.

Conventionally, the substrate is not subjected to the preprocess or the like during the substrate temperature increase for raising the substrate temperature up to the film-forming temperature from the room temperature, before the source gas is supplied in the film-forming step, but in this invention, the plural kinds of remote plasma processes selected from the RPH process, the RPN process, and the RPO process are successively applied to the substrate as the substrate surface modifying process one by one during the substrate temperature increase (in the above-described embodiment, the RPH process, the RPN process, and the RPO process are successively performed in this order). This means that, when the source gas is supplied onto the substrate 4 after the substrate temperature increase is finished, the HfO$_2$ is formed over the base, that is the substrate surface having undergone the aforesaid modifying process, and consequently, no incubation time occurs, thereby enabling the elimination of a nucleation process. It is thought that this results in the formation of the thin film excellent in flatness. In addition, it is thought that the plural kinds of remote plasma processes described-above enable effective and efficient removal of the eliminated gas such as H$_2$O from the built-up film and other contaminants and prevention of the influence thereof to the formed film. Moreover, the use of the aforesaid plural kinds of remote plasma processes can greatly save an enormous amount of labor and expenses which have been conventionally spent in the modifying process and simplify the substrate surface modifying process, compared with the conventional method. Further, by this simplification, the substrate surface modifying process can be concentrated in the MOCVD apparatus to greatly reduce production cost. Incidentally, in the present invention, the gases activated by plasma is used in the preprocess, and the preprocess can be performed reliably even during the substrate temperature increase in which the substrate temperature has not reached the processing temperature (a relatively low temperature state) since plasma energy is larger than thermal energy.

Note that various forms can be taken depending on the cases, such as repeating a series of these processes a plurality of times, or performing these processes in a different order. For example, repeat of a series of the processes, namely, RPH process or RPCl process→RPN process→RPO process explained in the above embodiment as many times as possible during the substrate temperature increase is possible. Also possible is execution in a different order, that is, RPH process or RPCl process→RPO process→RPN process, or alternatively, RPO process→RPN process→RPH process or RPCl process. Also possible is the selection of two kinds of the processes, not performing all the processes of the RPH process or the RPCl process, the RPN process, and the RPO process, for example, RPH process or RPCl process→RPN process; RPO process→RPH process or RPCl process; RPN process→RPO process; or the RPO process→RPN process.

The execution of at least two processes that are the RPN process and the RPO process, among these preprocesses, is especially preferable, such as RPN process→RPO process, RPO process→RPN process, or the like. The preprocess of only the RPN single process can inhibit leak current but increases the interface defect density of the end device to degrade electric parameters such as flat band voltage Vfb and mobility $\mu$. The preprocess of only the RPO single process can reduce the interface defect of the end device but increases the leak current to lower the limit of downsizing the device. On the other hand, the execution of RPN process→RPO process or RPO process→RPN process allows the disadvantages of the aforesaid single processes to be mutually complemented. Further, when RPN process→RPO process Or RPO process→RPN process is repeated a plurality of times, the abovementioned complementary effect can be strengthened.

Further, it is also possible to perform these processes not during the substrate temperature increase but while a fixed temperature for the preprocess (for example, a fixed temperature in the range from the room temperature to the film-forming temperature and no higher) is maintained, or after the substrate temperature increase. Since these preprocesses are basically measures for improving the performance and the quality of the end device, the form thereof varies depending on the intended use of the device.

After the RPO process in Step 204, it needs some time for the temperature of the substrate 4 to be raised up to the predetermined film-forming temperature of 390° C. to 440° C. This temperature increase normally takes one minute to two minutes and 30 seconds. During this time, if there is enough time, it is preferable to repeat the aforementioned cycle of RPH process (Step 202)→RPN process (Step 203)→RPO process step (Step 204) a plurality of times because the effect of improving flatness and removing the eliminated gas is enhanced. It is also preferable to have a non-reactive gas supply step of supplying an inert gas such as N$_2$ at each interval of the RPH process (Step 202), the RPN process (Step 203), and the RPO process (Step 204).

After the preprocess step, the film-forming step is started after the substrate temperature reaches the predetermined film-forming temperature. First, in the film-forming process in Step 205, the valve 22 is closed and the valve 21 is opened, the flow rate of Hf-(MMP)$_4$ from the film-forming source supply unit 9 is controlled by the liquid flow rate controller 28 and Hf-(MMP)$_4$ is vaporized in the vaporizer 29, and the vaporized source gas is supplied to the substrate 4 in the reaction chamber 1. It is preferable that the valve 20 is kept open both at the time of this source gas supply and during the subsequent RPO process (Step 206) to constantly keep the inert gas (N$_2$ or the like) flowing from the inert gas supply unit 10 while the flow rate thereof is being controlled by the mass flow controller 46 because the source gas is diluted and stirred by the inert gas. The source gas supplied from the source gas supply pipe 5b and the inert gas supplied from the inert gas supply pipe 5a are mixed in the source supply pipe 5, introduced to the film-forming showerhead portion 6a as the mixed gas, and supplied onto the substrate 4 on the susceptor 2 in a shower via a number of the holes 8. The supply of the abovementioned mixed gas for a predetermined period of time causes the HfO$_2$ film with a predetermined film thickness to be formed over the substrate surface which has been modified in the above-described preprocess step (the plural kinds of remote plasma processes) by a thermal CVD method (Step 205). After the predetermined period of time, the valve 21 is closed and the valve 22 is opened to stop the supply of the source gas onto the substrate 4 and exhaust the source gas through the source gas bypass pipe 14a (note that the supply of the source gas from the film-forming source supply unit 9 is not stopped though the supply of the source gas onto the substrate 4 is stopped).

After the film-forming process in Step 205, the RPO process (Step 206) is started. After the valve 21 is closed, the valve 24 is opened, and the oxygen radical from the radical generating unit 11 is supplied onto the substrate 4 for a desired period of time to remove impurities such as —OH and —CH mixed into the HfO$_2$ film formed in the film-forming process (Step 205), thereby completing the RPO process, Incidentally, the RPO process also has, similarly to the preprocess, the effect of inhibiting the influence of the eliminated gas from the built-up film deposited in the reaction chamber. Further, since the substrate 4 is kept at the predetermined temperature (the same temperature as the film-forming temperature) by the heater 3 while being rotated also in the film-forming step (Steps 205 and 206), similarly to the preprocess step (Steps 202, 203, and 204), the formation of a uniform film over the substrate surface and quick and uniform removal of the impurities such as C and H in the formed film are enabled. After the desired period of time, the valve 24 is closed and the valve 23 is opened to stop the supply of the oxygen radical onto the substrate 4 and exhaust the oxygen radical through the radical bypass pipe 14b (note that the supply of the oxygen radical from the radical generating unit 11 is not stopped though the supply of the oxygen radical onto the substrate 4 is stopped).

Step 205 for the film-forming process and Step 206 for the RPO process described above are defined as one cycle and this cycle is repeated a plurality of times. This cycle process enables the formation of the $HfO_2$ film with the predetermined film thickness having a very small amount of CH and OH mixed therein. Further, this cycle process (especially the RPO process) also has, similarly to the preprocess step, the effect of sufficiently inhibiting the influence of the eliminated gas from the built-up film deposited in the reaction chamber. Therefore, when the plural kinds of remote plasma processes in the preprocess step and the aforesaid cycle process in the film-forming step are both performed, the influence of the eliminated gas from the built-up film deposited in the reaction chamber can be further inhibited. Incidentally, it is preferable to have a non-reactive gas supply step of supplying an inert gas such as $N_2$ between Step 205 for the film-forming process and Step 206 for the RPO process.

The advantages of repeating Step 205 for the film-forming process and Step 206 for the RPO process a plurality of times here are as follows. In applying the RPO process (process of removing impurities such as C and H) to the $HfO_2$ film formed with good coverage over a deep trench, if the RPO process is performed after the $HfO_2$ film is formed thick, for example, 100 angstroms only by one process, it becomes difficult to supply the oxygen radical up to a deep portion of the trench. This is because the oxygen radical, before reaching the deep portion of the trench, is highly possible to react with C and H in the film deposited around an inlet of the trench (because the film thickness is as large as 100 angstroms and an amount of the impurities is large accordingly), thereby relatively decreasing an amount of the radical reaching the deep portion of the trench, This makes it difficult to uniformly remove C and H in a short time.

On the other hand, when the formation of the $HfO_2$ film of 100 angstroms is divided by repeating $HfO_2$ film formation→RPO process a plurality of times, for example, seven times, the RPO process as the C and H removal process needs to be applied only to a portion of about 15 angstroms of the $HfO_2$ film. In this case, since the probability that the oxygen radical reacts with C and H in the film deposited around the inlet of the trench is not high (because the film thickness is as small as 15 angstroms and an amount of the impurities is small accordingly), the radical uniformly reaches the deep portion of the trench. This enables uniform removal of C and H in a short time. Further, repeating $HfO_2$ film formation→RPO process a plurality of times means repeating the RPO process having the effect of removing the eliminated gas which is caused from the built-up film deposited in the reaction chamber a plurality of times between the processes of forming the $HfO_2$ film, and consequently, efficiency of removing the eliminated gas from the built-up film is enhanced.

Preferable conditions in the film-forming step in the case when Hf-$(MMP)_4$ is used as the source are such that the processing temperature is 390° C. to 440° C. as previously stated and the pressure is about 100 Pa or lower. Preferable conditions in the RPO process step after the film-forming step are such that the processing temperature is 390° C. to 440° C., the pressure range is from about 100 Pa to about 1000 Pa, the flow rate of $O_2$ for radical generation is 100 sccm, and the flow rate of the inert gas Ar is 1 slm. Note that the film-forming step and the RPO process step are preferably performed at substantially the same temperature (the set temperature of the heater is preferably kept fixed without being changed). This is because without any temperature change in the reaction chamber, particles due to thermal expansion of peripheral components such as the showerhead and the susceptor do not easily occur and thus metal scattering from metal components (metal contamination) can be reduced.

After the $HfO_2$ film with the predetermined film thickness is formed over the substrate by the cycle process of the above-described film-forming step, namely, Step 205 for the film-forming process and Step 206 for the RPO process, the substrate is conveyed out of the apparatus (Step 207).

Figure 2:
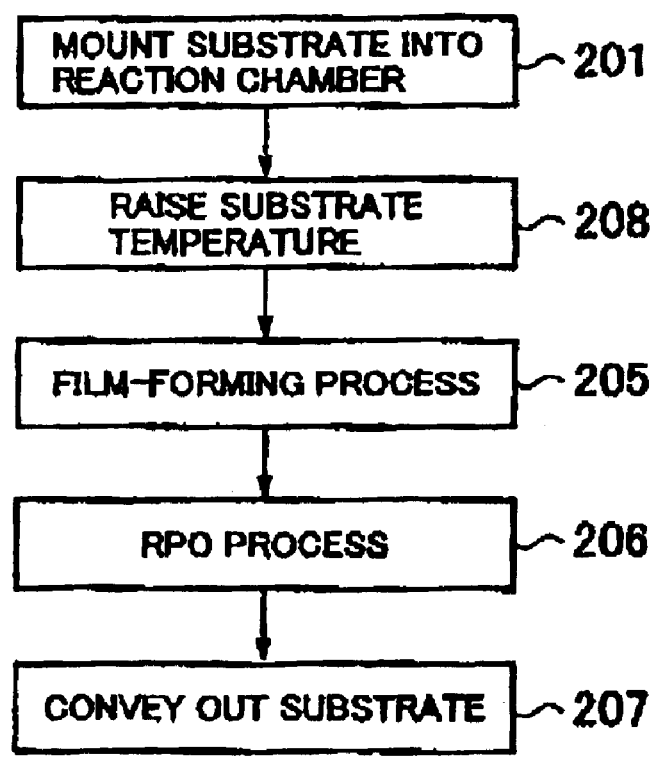
FIG. 2 is a process flow chart according to a conventional example.

In order to compare with the process flow of the first embodiment, a process flow of a conventional example is shown in FIG. 2. In the conventional example, the inert gas ($N_2$ or the like) is simply supplied to the substrate during the substrate temperature increase (Step 208), but in this embodiment, the RPH process, subsequently the RPN process, and subsequently the RPO process (Steps 202, 203, and 204) are performed during the substrate temperature increase. Accordingly, in this embodiment, the substrate temperature increase time in the conventional process is utilized for the newly added substrate surface modifying step by the plural kinds of remote plasma processes, and therefore, it is possible to inhibit the influence of the eliminated gas from the built-up film deposited in the reaction chamber and improve flatness of the CVD thin film, without lowering productivity. Further, in the conventional example, the film-forming process (Step 205) and the RPO process (Step 206) are performed only once, but in this embodiment, the film-forming process (Step 205) and the RPO process (Step 206) are repeated a plurality of times, which makes it possible to increase a removal amount of the impurities such as C and H in the deposited film and sufficiently inhibit the influence of the eliminated gas from the built-up film. In particular, since the plural kinds of remote plasma processes (Steps 202, 203, and 204) and the cycle process of repeating the film-forming process (Step 205) and the RPO process (Step 206) are combined in this embodiment, the influence of the eliminated gas from the built-up film can be further inhibited.

Further, since the $HfO_2$ film is formed using the thermal CVD method, it has a good film quality unlike a film formed by an AU) method. Specifically, in ALD (Atomic Layer Deposition), atomic layers are formed one by one to form a film at low processing temperature and pressure, and the film formation is executed at low temperature from the beginning to the end so that a large amount of impurities is taken into the film, resulting in a bad film quality. On the other hand, in this embodiment, a thin film (about 0.5 angstrom to about 30 angstroms) is formed a plurality of times in the film-forming step, using thermal CVD reaction whose processing temperature and pressure are higher than those of AU) so that a denser and better quality film than the film by AUD is obtainable.

It is preferable to have the non-reactive gas supply step of supplying the non-reactive gas between the supply of the source gas and the supply of the oxygen radical in the film-forming step, and it is also preferable to have the non-reactive gas supply step of supplying the non-reactive gas at each interval of the RPH process, the RPN process, and the RPO process in the preprocess step as well, as stated above, and a non-reactive gas supply step of supplying a non-reactive gas is preferably further performed between the preprocess step and the film-forming step as well. Since the inert gas $N_2$ is kept supplied throughout all the steps, stopping both the supply of the source gas and the supply of the radical into the reaction chamber 1 (exhausting both the source gas and the radical through the bypass pipe 14) automatically produces the state in which only $N_2$ that is the inert gas flows into the reaction chamber, which automatically turns out to be the non-reactive gas supply step.

The reason for supplying the non-reactive gas (the non-reactive gas supply process) between the supply of the source gas and the supply of the oxygen radical in the film-forming step is as follows. When the non-reactive gas (the inert gas such as $N_2$, Ar or He) is supplied after the source gas is supplied prior to the supply of the oxygen radical, the supply of the inert gas enables the removal of the source gas in the atmosphere in the reaction chamber at the time of the oxygen radical supply after the source gas supply, and when the non-reactive gas (the inert gas such as $N_2$, Ar or He) is supplied after the oxygen radical is supplied prior to the source gas supply, the inert gas supply enables the removal of the oxygen radical in the atmosphere inside the reaction chamber at the time of the source gas supply after the oxygen radical supply. In short, it is possible to prevent the source gas and the oxygen radical from concurrently existing in the reaction chamber, and as a result, the occurrence of the particles can be prevented.

The reason for dividing the showerhead 6 into the film-forming showerhead portion 6a and the radical showerhead portion 6b is as follows. When the source and the oxygen radical adhering to the inside of the showerhead 6 react with each other, the built-up film is also formed inside the showerhead 6. Dividing the showerhead 6 to which the source gas and the oxygen radical are supplied can effectively prevent the reaction of the source and the oxygen radical to inhibit the formation of the built-up film.

Further, in addition to dividing the showerhead 6, it is preferable that an inert gas is introduced to the radical showerhead portion 6b through the radical supply pipe 13 from a not-shown inert gas supply unit when the source gas is supplied to the substrate 4, and an inert gas is introduced to the film-forming showerhead portion 6a through the source supply pipe 5 from the inert gas supply unit 10 when the oxygen radical is supplied to the substrate 4. Incidentally, the inert gas supply unit supplying the inert gas to the radical showerhead portion 6b through the radical supply pipe 13 and the inert gas supply unit supplying the inert gas to the film-forming showerhead portion 6a through the source supply pipe 5 are preferably the same. When the inert gas is thus introduced to the showerhead portion 6b through the radical supply pipe 13 or to the showerhead portion 6a through the source supply pipe 5 which is not used in the film-forming step or the removing step respectively, the formation of the built-up film inside the source supply pipe 5, the radical supply pipe 13, and the showerhead 6 can be further inhibited effectively.

Further, the reason why the oxygen radical/source gas used in the subsequent step is not stopped but exhausted through the bypass pipes 14 during the supply of the source gas/oxygen radical into the reaction chamber is as follows. The supply of the source gas/oxygen radical requires some preparation and it takes time for either of those supplies to be started. Therefore, during the processes, the supply of the source gas/oxygen radical is not stopped but continued constantly, and each of the source gas and the oxygen radical is exhausted through the bypass pipe 14 when not in use. Consequently, when each of them is to be used, the supply of the source gas/oxygen radical into the reaction chamber can be immediately started only by opening/closing the valves 21 to 24, which enables the improvement in throughput.

Further, the inert gas ($N_2$, Ar, He, or the like) is preferably kept supplied constantly into the reaction chamber 1 while the substrate processing apparatus is in operation. Specifically, the inert gas is kept supplied into the reaction chamber 1 constantly from the inert gas supply unit 10 by opening the valve 20 before the substrate is conveyed therein. The inert gas is constantly kept flowing not only at the time of the substrate conveyance, during the substrate temperature increase period, and during the heating period after the temperature of the substrate is raised, but also at the time of the source gas supply and the oxygen radical supply. This allows the inside of the reaction chamber to be constantly in a purged condition by the inert gas, so that it is possible to prevent adhesion of the particles and the metal contaminants to the substrate, back diffusion to the reaction chamber of the source gas adhering to the exhaust port 7a and the exhaust pipe 7, and back diffusion into the reaction chamber of oil from a not-shown vacuum pump.

In the above-described embodiment, the method in which the preprocess is performed during the substrate temperature increase is explained, but the preprocess step and a part of the film-forming step may be performed during the substrate temperature increase. For example, it is possible to perform the preprocess step and initial film formation during the substrate temperature increase and the primary film formation after the substrate temperature increase in this case, in the initial film formation, the RPO process is performed after the source gas is made to adhere onto the substrate in an unreacted state to forcibly cause film-forming reaction. For example, it is possible to perform [RPH process→RPN process→RPO process] (preprocess)→[source gas supply→RPO process] (initial film formation) during the substrate temperature increase, and perform [source gas supply→RPO process]×n cycles (the process in which the source gas supply and the RPO process are repeated n cycles) as the primary film formation after the substrate temperature increase. Alternatively, it is also possible to perform [RPH process→RPN process→RPO process] (preprocess)→[Source gas supply→RPO process]×n cycles (initial film formation) during the substrate temperature increase and perform [source gas supply→RPO process]×n cycles (primary film formation) after the substrate temperature increase.

In the above-described embodiment, oxygen $O_2$ is used to generate the oxygen radical, but an oxygen-containing gas such as $N_2O$, NO, or $O_3$ other than $O_2$ is usable. As for $N_2O$ and NO, similarly to $O_2$, each is activated by the radical generating unit 11 to generate the oxygen radical and thereafter, supplied to the reaction chamber 1. However, as for $N_2O$ and $O_3$, each may be supplied to the reaction chamber 1 as it is without being activated. This is because the oxygen radical is generated in the reaction chamber 1 by heat after the supply though it is supplied without being activated, which is practically equivalent to the supply of the oxygen radical to the substrate. Therefore, the case where the oxygen radical is supplied onto the substrate in the present invention includes the case where $N_2O$ or $O_3$ is supplied as it is without being activated.

In the embodiment described above, the formation of the amorphous $HfO_2$ film is explained, but the present invention is also applicable to the formation of an amorphous Hf silicate film. Further, the present invention is also applicable to the formation of other kinds of films (for example, a TiN film, a TaN film, a $TiO_2$ film, an $SiO_2$ film, an $Al_2O_3$ film, and so on) such as a metal oxide film such as a Ta$_2$O$_5$ film and a ZrO$_2$ film, and a metal film such as an Ru film.

In the above-described embodiment, the film formation using mainly the thermal CVD method is explained, but the present invention is applicable to the film formation using the ALD method. For example, it is possible to perform [RPN process→RPO process] (preprocess) during the substrate temperature increase period and perform [Source gas supply→RPO process]×n cycles (the process in which the source gas supply and the RPO process are repeated n cycles to form a film by the ALD method) after the substrate temperature increase.

Figure 7:
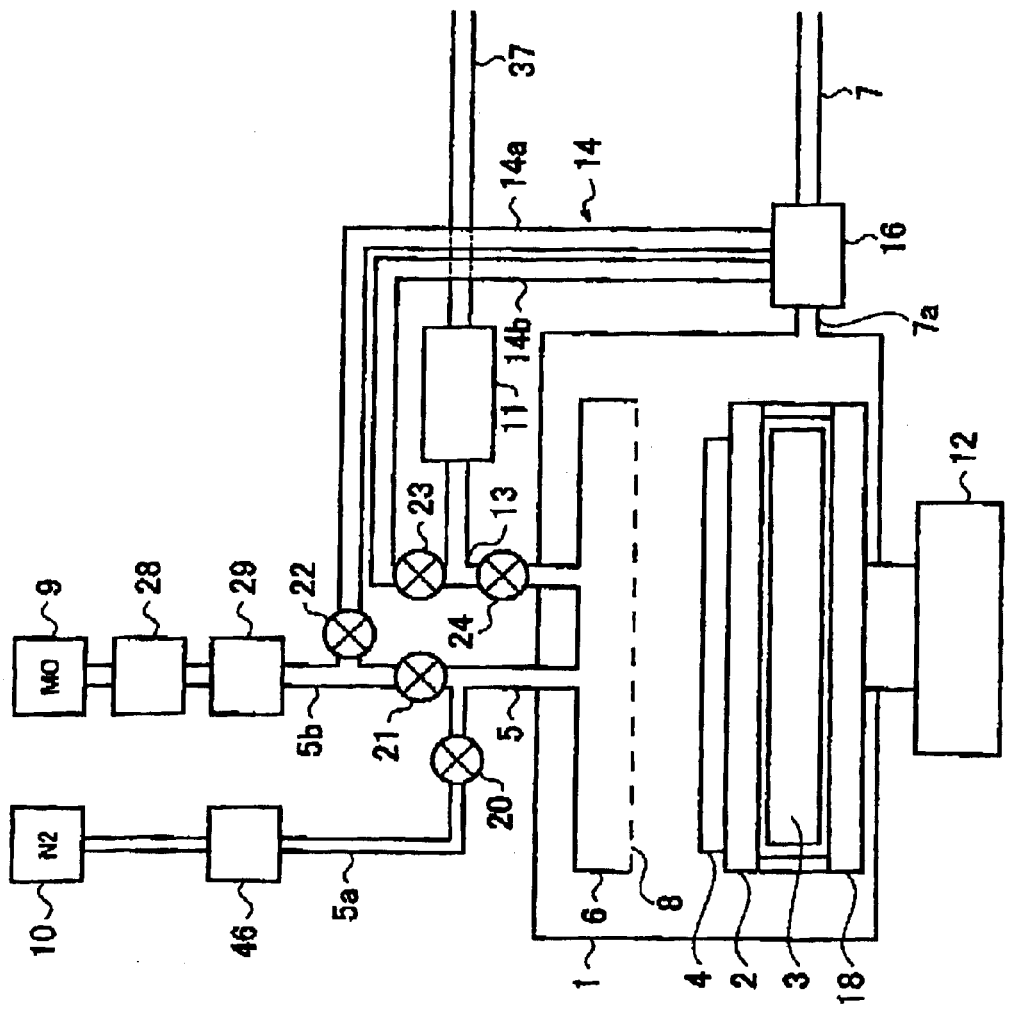
FIG. 7 is a schematic explanatory view of a reaction chamber according to a modification example of the embodiment.

In the above-described embodiment, the explanation is given on the case where the showerhead 6 is divided into the film-forming showerhead portion 6a and the radical showerhead portion 6b by the partition plate 15 and the source gas and the activated gases including the radicals are separately supplied from the respective showerheads, but such a structure as shown in FIG. 7 is adoptable that the showerhead 6 does not have the partition plate and serves both as the film-forming showerhead portion and the radical showerhead portion so that the source gas and the activated gases including the radicals are supplied from the same showerhead 6.

By using the same showerhead 6 as a supply port for the source gas supplied to the substrate 4 in the film-forming process and for the activated gases including the radicals which are supplied to the substrate 4 in the RPO process after the film formation and in the RPH process, the RPN process, and the RPO process as the preprocess, foreign matter (particle sources) adhering to the inside of the showerhead 6 can be covered with the HfO$_2$ film for coating to prevent the foreign matter from falling down onto the substrate 4. Moreover, the film that coats the inside of the showerhead 6 is exposed to the activated gases including the radicals after the coating so that a mixed amount of the impurities such as C and H included in the coating film inside the showerhead 6 can be greatly reduced. In addition, though there are a residual byproduct and cleaning gas (this is called a cleaning residue) adhering to the inside of the reaction chamber 1 and the inside of the showerhead 6 when the inside of the reaction chamber 1 is cleaned with a s gas including Cl such as ClF$_3$, the use of the same supply port for the source gas and the activated gases including the radicals enables more effective removal of this cleaning residue remaining in the showerhead 6 by the action of the activated gases including the radicals.

The base of the formed film is not limited to the silicon substrate but may be a silicon substrate having a thin SiO$_2$ film bonded on the surface thereof, a silicon substrate having a thin Si$_3$N$_4$ film bonded on the surface thereof, or the like.

Figure 3:
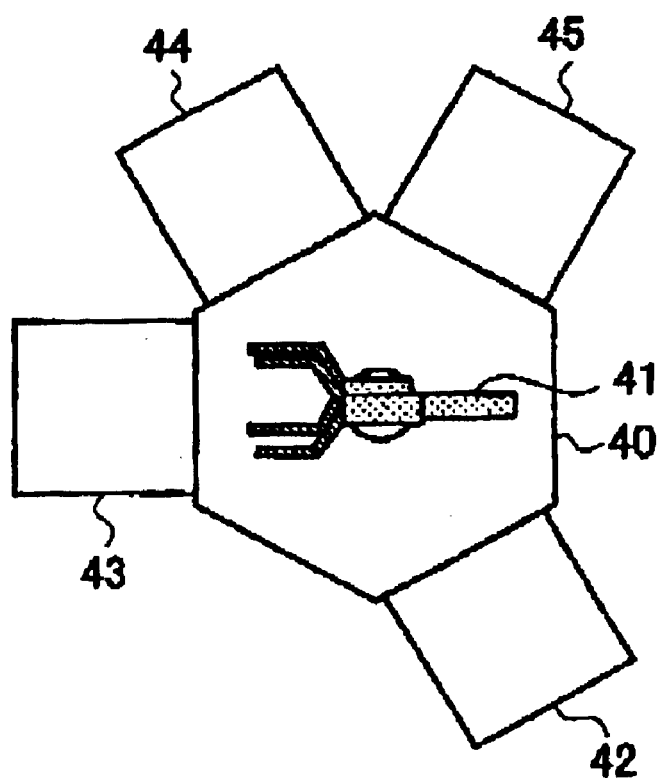
FIG. 3 is a conceptual view showing the configuration of a cluster tool in the embodiment.

The configuration of a cluster tool in this embodiment is shown in FIG. 3.

The cluster tool includes a substrate conveying chamber 40 provided with a substrate conveying robot 41, a load lock chamber 42 through which the substrate is conveyed into/out of the tool, a first reaction chamber 43 in which the substrate surface treatment (RCA cleaning and so on) is performed, a second reaction chamber 44 in which the substrate shown in FIG. 4 undergoes the preprocess and the film formation of the HfO$_2$ film, and a third reaction chamber 45 in which electrodes are formed on the thin film, The second reaction chamber 44 among them corresponds to the reaction chamber 1 shown in FIG. 4.

In the configuration of a conventional cluster tool, the substrate surface treatment such as the RCA cleaning and the substrate surface modifying process such as the oxynitridation process are performed in the first reaction chamber 43, the HfO$_2$ film is formed in the second reaction chamber 44, and the electrodes are formed in the third reaction chamber 45. Further, different reaction chambers are sometimes used for the substrate surface treatment such as the RCA cleaning and for the substrate surface modifying process such as the oxynitridation process performed in the first reaction chamber 43.

In contrast, according to this embodiment, in the first reaction chamber 43, the substrate surface treatment (removing process of a natural oxide film formed on the substrate surface, metal contaminants, and so on) such as the RCA cleaning is performed after the substrate is conveyed into the load lock chamber 42 from the outside of the tool; in the second reaction chamber 44, the HfO$_2$ film-forming process and the RPO process (impurity removing process) are repeated as the film-forming step to form the HfO$_2$ film with a predetermined film thickness after the RPH process, the RPN process, and the RPO process are performed as the preprocess step (RPH process→RPN process→RPO process→[film-forming process→RPO process]×n cycles); and in the third reaction chamber 45, the electrodes are formed (poly-Si thin film formation and thermal annealing). Then, the substrate over which the electrodes are formed is conveyed out of the tool through the load lock chamber 42.

As described hitherto, in the present invention, the substrate surface modifying process is performed as the preprocess step immediately before the thin film formation in the reaction chamber where the thin film is conventionally formed (the preprocess step and the film-forming step are successively performed in the same reaction chamber), so that the re-contamination of the substrate surface can be reduced to the minimum, and consequently, there is such an advantage that, unlike the conventional method, much time and energy are not spent for the substrate surface modifying process and no re-contamination during the substrate conveyance occurs. Further, the chamber for the preprocess step can be omitted and the same remote plasma unit can be used for the preprocess step and the film-forming step so that foot print (installation area) of the tool can be reduced and cost for the tool can also be reduced.

Further, since the same reaction chamber is used for the preprocess step and the film-forming step, it is possible to perform the preprocess, utilizing the conventional substrate heating time in this reaction chamber. Therefore, the concentration of these two processes in one reaction chamber, does not increase the tact time.

Moreover, since the preprocess step and the film-forming step are performed in the same reaction chamber, it is possible to form a film of SiO$_2$, SiN, SiON, or the like on the substrate surface immediately after the preprocess of the substrate (for example, high-cleaning process such as RPH), which enables the formation of a high quality interface layer.

Incidentally, the use of the same reaction chamber for the preprocess step including the RPH and the film-forming step of repeating the film-forming process and the RPO process a plurality of times is expected to involve such a problem that, even when the N$_2$ purge is performed after the film-forming step, oxygen in the RPO process performed after the film-forming process and so on remains in the reaction chamber, and the reaction of this residual oxygen with a hydrogen activated species supplied in the RPH process in the preprocess step for processing a subsequent substrate causes moisture generation in this reaction chamber so that the metal components are oxidized inside the reaction chamber to generate metal contaminants, but continuous execution of the RPH process for a predetermined time or longer enables the removal of the metal contaminants so that this problem is avoidable.

Incidentally, in some cases, the substrate before being processed in the cluster tool has already undergone the process corresponding to the RCA cleaning, and in this case, if the natural oxide film is only slightly formed thereon and contaminated by the atmosphere which is used, it is also possible to omit the first reaction chamber 43 for further performing the substrate surface treatment (RCA cleaning or the like) therein in the above-described cluster tool. In this case, the substrate surface treatment step (process of removing the natural oxide film formed on the substrate surface, the metal contaminants, and so on) is performed in the second reaction chamber 44 before the RPH process, the RPN process, and the RPO process are performed as the preprocess step therein. This means that the substrate surface treatment step, the preprocess step, and the film-forming step are successively performed in one reaction chamber.

An RPDC (Remote Plasma Dry Cleaning) process is preferable as the process performed in the substrate surface treatment step. Here, the RPDC process means a remote plasma dry cleaning process in which a radical generated by activating a cleaning gas ($Cl_2$ or the like) using plasma in the remote plasma unit provided outside the reaction chamber is supplied to the substrate in the reaction chamber, thereby removing the natural oxide film formed on the substrate surface, the metal contaminants, and so on.

The processes performed in the second reaction chamber 44 are as follows. Specifically, after the RPDC process which uses $Cl_2$ or the like as the substrate surface treatment step, the RPH process, the RPN process, and the RPO process follow as the preprocess, and thereafter, the film-forming process and the RPO process (impurity removing process) are repeated as the film-forming step to form the thin film with a predetermined film thickness (RPDC process→RPH process→RPN process→RPO process→[film-forming process→RPO process]×n cycles). Incidentally, it is possible to remove $Cl_2$ residues in the RPDC process and sufficiently remove organic substance and the natural oxide film from the substrate surface by performing the RPH process after the RPDC process. Therefore, it is preferable to perform the RPH process after the RPDC process.

As described above, since the first reaction chamber 43 in which the substrate surface treatment step (RCA cleaning or the like) is performed is omitted, and the substrate surface treatment step is performed immediately before the preprocess step in the reaction chamber in which the preprocess step and the film-forming step are performed (the substrate surface process, the preprocess, and the film-forming process are successively performed in the same reaction chamber), such advantages are brought about that the re-contamination of the substrate surface can be reduced to the minimum and no re-contamination during the substrate conveyance occurs. Further, the chamber for the substrate surface treatment can be omitted and the same remote plasma unit can be used for the substrate surface treatment, the preprocess, and the film-forming process so that it is made possible to reduce the foot print of the tool and cost for the tool.

In the foregoing, the embodiment of the present invention is explained, and the following (1) to (9) can be also considered as effective modification examples of the process flow. In the explanation below, a series of processes put in { } are processes performed in the same reaction chamber.

(1) {RPH or RPCl→RPN→RPO→film formation}

The RPH process or the RPCl process, the RPN process, and the RPO process are performed as the preprocess in this order. Here, RPCl is a chlorine preprocess in which a chlorine-containing gas is activated and supplied to the substrate. Film formation corresponds to the film-forming step previously described, and to be more specific, corresponds to (source gas supply→activated gas supply)×n cycles (the same applies to the explanation below). These processes are performed in the same reaction chamber, for example, in the second reaction chamber 44.

(2) {RPH or RPCl→RPO→RPN→film formation}

The RPH process or the RPCl process, the RPO process, and the RPN process are performed as the preprocess in this order. These processes are performed in the same reaction chamber, for example, in the second reaction chamber 44.

(3) {RPH or RPCl→(RPN→RPO)×n→film formation}

The RPH process or the RPCl process and (RPN process→RPO process)×n cycles are performed as the preprocess in this order. These processes are performed in the same reaction chamber, for example, in the second reaction chamber 44.

(4) {RPH or RPCl→(RPO→RPN)×n→film formation}

The RPH process or the RPCl process and (RPO process→RPN process)×n cycles are performed as the preprocess in this order. These processes are performed in the same reaction chamber, for example, in the second reaction chamber 44.

(5) {RCA cleaning or RPDC}→{(RPN→RPO)→film formation}

The RCA cleaning or the RPDC (natural oxide film removal) process is first performed in the first reaction chamber 43, subsequently the RPN process and the RPO process are performed as the preprocess in this order in the second reaction chamber 44, and thereafter, the film is formed therein.

(6) {RCA cleaning or RPDC}→{(RPO→RPN)→film formation}

The RCA cleaning or the RPDC (natural oxide film removal) process is first performed in the first reaction chamber 43, subsequently the RPO process and the RPN process are performed as the preprocess in this order in the second reaction chamber 44, and thereafter, the film is formed therein.

(7) {RCA cleaning or RPDC}→{(RPN→RPO)×n→film formation}

The RCA cleaning or the RPDC (natural oxide film removal) process is first performed in the first reaction chamber 43, subsequently the RPN process and the RPO process are repeated n cycles in this order as the preprocess in the second reaction chamber 44, and thereafter, the film is formed therein.

(8) {RCA cleaning or RPDC}→{(RPO→RPN)×n→film formation}

The RCA cleaning or the RPDC (natural oxide film removal) process is first performed in the first reaction chamber 43, subsequently the RPO process and the RPN process are repeated n cycles in this order as the preprocess in the second reaction chamber 44, and thereafter, the film is formed therein.

(9) {(RPO→RPH or RPCl)×n→film formation}

As the preprocess, a layer in which the metal contaminants are taken is formed and is removed, and a process of oxygen termination is performed. To be more specific, first, while the contaminants such as organic substance are removed by the RPO process from the substrate contaminated with the organic substance and the metals, an $SiO_2$ film including metal is formed over the substrate. Next, the $SiO_2$ film including the metal is removed by the RPH process (or the RPCl process). Incidentally, at this time, the $SiO_2$ film including the metal can be easily removed. It is reasoned that this is because the $SiO_2$ film including the metal is in an amorphous state. Then, the step of these RPO process→RPH process (or RPCl process) is repeated so that the metal, the organic substance, and so on put inside the substrate surface can be removed.

According to the present invention, the influence of the eliminated gas from the built-up film deposited inside the reaction chamber can be effectively and efficiently inhibited and the incubation time can be reduced to improve flatness of the thin film. Further, an enormous amount of labor and expenses which have conventionally been spent for measures against the eliminated gas from the built-up film can be greatly saved and the substrate surface modifying process as the preprocess step can be simplified. Moreover, the substrate surface modifying process can be concentrated in the MOCVD apparatus so that production cost can be greatly lowered.

Further, according to the present invention, since the film-forming step can be performed successively immediately after the preprocess step, it is possible to prevent the re-contamination of the substrate surface which is cleaned in the preprocess. Production cost can be greatly reduced as well.

Further, according to the present invention, it is possible to inhibit the influence of the eliminated gas from the built-up film and improve flatness of the foamed film by controlling the incubation time, without lowering productivity.

What is claimed is:

1. A manufacturing method of a semiconductor device, comprising:
    performing a preprocess to a substrate from which a natural oxide film is removed; and
    subsequent to said preprocess, forming a metal thin film or a metal oxide thin film over the substrate,
    wherein said preprocess includes activating a nitrogen-containing gas and supplying the activated nitrogen-containing gas to the substrate and activating an oxygen-containing gas and supplying the activated oxygen-containing gas to the substrate.

2. A manufacturing method of a semiconductor device, comprising:
    performing a preprocess to a substrate; and
    subsequent to said preprocess, forming a metal thin film or a metal oxide thin film over the substrate,
    wherein said preprocess includes activating a hydrogen-containing gas and supplying the activated hydrogen-containing gas to the substrate or activating a chlorine-containing gas and supplying the activated chlorine-containing gas to the substrate, activating a nitrogen-containing gas and supplying the activated nitrogen-containing gas to the substrate, and activating an oxygen-containing gas and supplying the activated oxygen-containing gas to the substrate, and
    wherein said preprocess and film-forming are performed in one reaction chamber.

3. A manufacturing method of a semiconductor device, comprising:
    activating a gas and supplying the activated gas to a substrate; and
    subsequent to said preprocess, forming a metal thin film or a metal oxide thin film over the substrate,
    wherein said preprocess is performed during substrate temperature increase for raising a substrate temperature up to a film-forming temperature before a source gas is supplied in the film-forming.

4. A manufacturing method of a semiconductor device according to claim 1,
    wherein, in said film-forming,
    supplying a source gas to the substrate and activating a gas and supplying the activated gas after said source gas supply is repeated a plurality of times, thereby forming a thin film having a desired film thickness.

5. A manufacturing method of a semiconductor device according to claim 1, wherein said preprocess further includes, prior to said nitrogen preprocess and said oxygen preprocess, activating a hydrogen containing gas and supplying the activated hydrogen-containing gas to the substrate or activating a chlorine containing gas and supplying the activated chlorine-containing gas to the substrate.

6. A manufacturing method of a semiconductor device according to claim 1, wherein said preprocess and said film-forming are performed in one reaction chamber.

7. A manufacturing method of a semiconductor device according to claim 2, wherein said nitrogen preprocess and said oxygen preprocess are performed after said hydrogen preprocess or chlorine preprocess.

8. A manufacturing method of a semiconductor device according to claim 2, wherein said preprocess is performed during substrate temperature increase for raising a substrate temperature up to a film-forming temperature, before the source gas is supplied in said film-forming.

9. A manufacturing method of a semiconductor device according to claim 3, wherein said preprocess includes activating a nitrogen containing gas and supplying the activated nitrogen-containing gas and activating an oxygen containing gas and supplying the activated oxygen-containing gas.

10. A manufacturing method of a semiconductor device according to claim 3, wherein said preprocess includes activating a hydrogen containing gas and supplying the activated hydrogen-containing gas or activating a chlorine containing gas and supplying the activated chlorine-containing gas, activating a nitrogen containing gas and supplying the activated nitrogen-containing gas, and activating an oxygen containing gas and supplying the activated oxygen-containing gas.

11. A manufacturing method of a semiconductor device according to claim 1, wherein the gas is activated in said preprocess by using plasma.

12. A manufacturing method of a semiconductor device according to claim 1, wherein the gas is activated in said preprocess by using plasma in a remote plasma unit provided outside the reaction chamber in which the substrate is processed.

13. A manufacturing method of a semiconductor device according to claim 1, wherein said hydrogen preprocess is a remote plasma hydrogenation process in which the hydrogen-containing gas is activated in a remote plasma unit and the activated hydrogen-containing gas is supplied to the substrate to hydrogenate a surface of the substrate, said chlorine preprocess is a remote plasma chlorination process in which the chlorine-containing gas is activated in the remote plasma unit and the activated chlorine-containing gas is supplied to the substrate to chlorinate the surface of the substrate, said nitrogen preprocess is a remote plasma nitridation process in which the nitrogen-containing gas is activated in the remote plasma unit and the activated nitrogen-containing gas is supplied to the substrate to nitride the surface of the substrate, and said oxygen preprocess is a remote plasma oxidation process in which the oxygen-containing gas is activated in the remote plasma unit and the activated oxygen-containing gas is supplied to the substrate to oxidize the surface of the substrate.

14. A manufacturing method of a semiconductor device according to claim 1, wherein a source gas used in said film-forming is an organic source gas.

15. A manufacturing method of a semiconductor device according to claim 1, wherein said film-forming includes supplying a source gas to the substrate and subsequent to said source gas supply activating a gas and supplying the activated gas to the substrate, the source gas used in said film-forming is a gas obtained by vaporizing $Hf[OC(CH_3)_2CH_2OCH_3]_4$, and the formed thin film is a film including Hf.

16. A manufacturing method of a semiconductor device according to claim 1, wherein said film-forming includes supplying a source gas to the substrate and subsequent to said source gas supply activating a gas and supplying the activated gas to the substrate, the source gas used in said film-forming is a gas obtained by vaporizing $Ta(OC_2H_5)_5$, and the formed thin film is a film including Ta.

17. A manufacturing method of a semiconductor device according to claim 1, wherein said film-forming includes supplying a source gas to the substrate and subsequent to said source gas supply activating a gas and supplying the activated gas to the substrate, the source gas used in said film-forming is a gas obtained by vaporizing any one of $Ru(C_2H_5C_5H_4)_3$(bisethylcyclopentadienylruthenium), $Ru(C_5H_5)(C_4H_9C_5H_4)$ (buthylruthenocene), $Ru[CH_3COCHCO(CH_2)_3CH_3]_3$ (tris-2,4octanedionatoruthenium), $Ru(C_2H_5C_5H_4)((CH_3)C_5H_5)$ (2,4dimethylpentadienylethylcyclopentadienylruthenium, and $Ru(C_7H_8)(C_7H_{11}O_2)$, and the formed film is a film including Ru.

18. A manufacturing method of a semiconductor device according to claim 1, wherein said film-forming includes supplying a source gas to the substrate and subsequent to said source gas supply activating a gas and supplying the activated gas to the substrate, the source gas used in said film-forming is a gas obtained by vaporizing any one of $Ti[(OCH(CH_3)_2)]_4$, $Ti(OCH_2CH_3)_4$, $Ti[N(CH_3)_3]_4$, and $Ti[N(CH_3CH_2)_2]_4$, and the formed film is a film including Ti.

19. A manufacturing method of a semiconductor device according to claim 1, wherein said film-forming includes supplying a source gas to the substrate and subsequent to said source gas supply activating a gas and supplying the activated gas to the substrate, and, in said activated gas supply at least one kind of gas selected from a group consisting of $O_2$, $N_2O$, NO, Ar, $H_2$, $N_2$, and $NH_3$ is activated by plasma and the activated gas is supplied.

20. The manufacturing method of the semiconductor device according to claim 1, wherein the nitrogen preprocess step and the oxygen preprocess step are performed in this order.

* * * * *

UNITED STATES PATENT AND TRADEMARK OFFICE
CERTIFICATE OF CORRECTION

PATENT NO. : 6,825,126 B2
DATED : November 30, 2004
INVENTOR(S) : Masayuki Asai et al.

It is certified that error appears in the above-identified patent and that said Letters Patent is hereby corrected as shown below:

Column 31,
Line 30, please delete "Ru($C_2H_5C_5H_4$)$_3$(bisethylcyclopentadienylruthenium)" and replace with -- Ru($C_2H_5C_5H_4$)$_2$(bisethylcyclopentadienylruthenium) --

Column 32,
Line 13, please delete "Ti[(OCH($CH_3$)$_2$)]$_4$, Ti(OCH$_2$CH$_3$)$_4$, Ti[N(CH$_3$)$_3$]$_4$," and replace with -- Ti[(OCH($CH_3$)$_2$)]$_4$, Ti(OCH$_2$CH$_3$)$_4$, Ti[N(CH$_3$)$_2$]$_4$, and --

Signed and Sealed this

Twenty-eighth Day of June, 2005

JON W. DUDAS
*Director of the United States Patent and Trademark Office*